US011502675B2

(12) United States Patent
Hama

(10) Patent No.: US 11,502,675 B2
(45) Date of Patent: Nov. 15, 2022

(54) SWITCH DRIVING DEVICE

(71) Applicant: ROHM CO., LTD., Kyoto (JP)

(72) Inventor: Kenji Hama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/419,505

(22) PCT Filed: Feb. 3, 2020

(86) PCT No.: PCT/JP2020/003901
§ 371 (c)(1),
(2) Date: Jun. 29, 2021

(87) PCT Pub. No.: WO2020/162389
PCT Pub. Date: Aug. 13, 2020

(65) Prior Publication Data
US 2022/0094346 A1 Mar. 24, 2022

(30) Foreign Application Priority Data

Feb. 7, 2019 (JP) .............................. JP2019-020839

(51) Int. Cl.
*H03K 3/00* (2006.01)
*H03K 17/16* (2006.01)
(Continued)

(52) U.S. Cl.
CPC ............ *H03K 17/063* (2013.01); *H02M 1/08* (2013.01); *H01L 25/072* (2013.01); *H03K 2217/0081* (2013.01)

(58) Field of Classification Search
None
See application file for complete search history.

(56) References Cited

U.S. PATENT DOCUMENTS 5,666,280 A * 9/1997 Janaswamy .......... H03K 17/063
363/17
7,265,601 B2 * 9/2007 Ahmad .................... H02M 1/08
327/403
(Continued)

FOREIGN PATENT DOCUMENTS

CN          107742620 A     2/2018
JP          2013-179821 A   9/2013
(Continued)

OTHER PUBLICATIONS

International Search Report issued in PCT/JP2020/003901, dated Apr. 21, 2020 (3 pages).

*Primary Examiner* — Kenneth B Wells
(74) *Attorney, Agent, or Firm* — Hamre, Schumann, Mueller & Larson, P.C.

(57) ABSTRACT

A switch driving device includes a gate driver, a bootstrap circuit, a current limiting portion, and a current control portion. The gate driver drives an N-type semiconductor switch element. The bootstrap circuit includes a boot capacitor and a boot diode and applies a voltage to the gate driver. The current limiting portion limits a current to be supplied to the boot capacitor. The current control portion controls operations of the current limiting portion. The current limiting portion is provided on a path that electrically connects the boot capacitor and the boot diode to each other.

17 Claims, 20 Drawing Sheets

(51) Int. Cl.
    *H02M 1/08*     (2006.01)
    *H02M 3/158*     (2006.01)
    *H03K 17/06*     (2006.01)
    *H01L 25/07*     (2006.01)

(56) References Cited

U.S. PATENT DOCUMENTS

| | | | |
|---|---|---|---|
| 8,710,875 B2* | 4/2014 | Bai | H02M 3/1588 |
| | | | 323/284 |
| 9,859,883 B2* | 1/2018 | Huang | H03K 17/162 |
| 10,008,932 B2* | 6/2018 | Umemoto | H02M 1/08 |
| 2009/0129038 A1 | 5/2009 | Takakusaki et al. | |
| 2010/0259238 A1* | 10/2010 | Cheng | H02M 1/36 |
| | | | 323/282 |
| 2011/0133711 A1* | 6/2011 | Murakami | H03K 17/0822 |
| | | | 323/282 |
| 2013/0241621 A1* | 9/2013 | Forghani-Zadeh | |
| | | | H03K 17/08122 |
| | | | 327/315 |
| 2018/0004238 A1* | 1/2018 | Shen | G05F 1/462 |

FOREIGN PATENT DOCUMENTS

| | | |
|---|---|---|
| JP | 2016-82281 A | 5/2016 |
| JP | 2016-158457 A | 9/2016 |
| JP | 2018-7403 A | 1/2018 |
| JP | 2018-22849 A | 2/2018 |
| WO | 2007/026944 A1 | 3/2007 |
| WO | 2019/244372 A1 | 12/2019 |

* cited by examiner

SWITCH DRIVING DEVICE

TECHNICAL FIELD

The present disclosure relates to a switch driving device.

BACKGROUND ART

Conventionally, switch driving devices that are used as switching regulators or motor drivers are known. Such a driving device includes an output circuit (half bridge circuit) including two semiconductor switch elements (an upper switch element and a lower switch element) that are connected in series, for example, and the upper switch element is connected to a driving power source. In some conventional cases, a bootstrap circuit is combined with the half bridge circuit to obtain a sufficient drive voltage when such an upper switch element is turned ON (see Patent Document 1, for example). The bootstrap circuit includes a boot capacitor, and a voltage (gate voltage) between the gate and the source of the upper switch element is obtained using a charging voltage of the boot capacitor.

PRIOR ART DOCUMENT

Patent Document

Patent Document 1: JP-A-2016-82281

SUMMARY OF THE INVENTION

Problems to be Solved by the Invention

In conventional switch driving devices, the charging voltage of the boot capacitor may become higher than the gate voltage (allowable gate voltage) that is allowed for the upper switch element (i.e., the boot capacitor may be excessively charged), depending on the configurations of the switch driving devices. However, in such a case, a signal that is input to the gate of the switch element becomes larger than the allowable gate voltage, and this may cause problems such as malfunctioning of the switch element.

In view of the above-described circumstances, the present disclosure aims to provide a switch driving device that is capable of reliably and stably driving a switch element.

Means for Solving the Problem

A switch driving device provided based on the present disclosure includes a gate driver configured to drive an N-type semiconductor switch element, a bootstrap circuit that includes a boot capacitor and a boot diode and is configured to apply a voltage to the gate driver, a current limiting portion configured to limit a current to be supplied to the boot capacitor, and a current control portion configured to control operations of the current limiting portion. The current limiting portion is provided on a path that electrically connects the boot capacitor and the boot diode to each other.

Effect of the Invention

With this configuration, the N-type semiconductor switch element can be appropriately driven.

Other features and advantages of the present disclosure will be clarified by a detailed description given below with reference to the accompanying drawings.

MODE FOR CARRYING OUT THE INVENTION

The following specifically describes preferred embodiments of the present disclosure with reference to the drawings.

In the present disclosure, terms such as "first", "second", "third", etc., are used simply as labels, and are not necessarily intended to give an order to matter described using these terms.

First Embodiment

Figure 1:
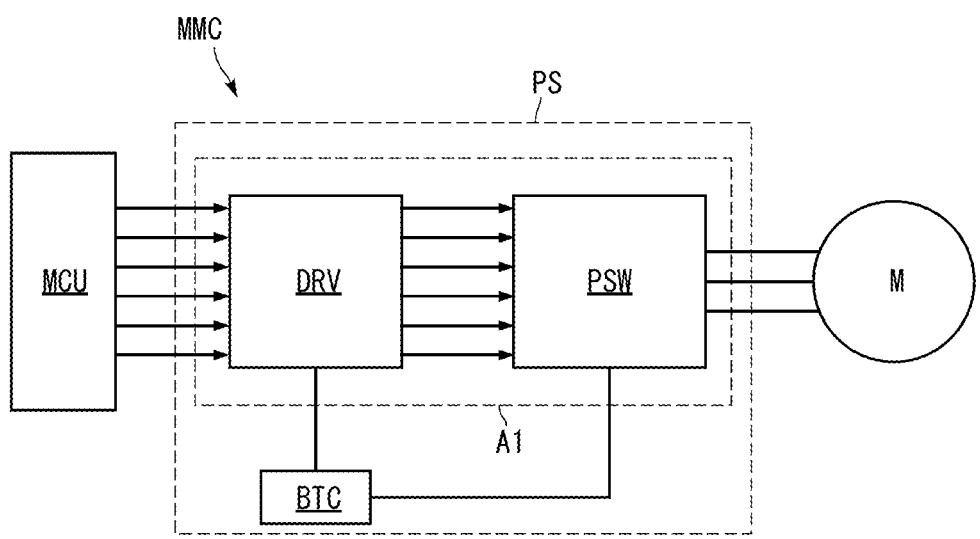
FIG. 1 is a schematic diagram showing a motor driving system in which a switch driving device according to a first embodiment is used.

FIG. 1 is a schematic diagram showing a motor driving system in which a switch driving device according to a first embodiment of the present disclosure is used. A motor driving system MMC shown in this drawing drives a motor M. The motor M is a three phase alternating current motor, for example. The motor M includes a U-phase coil MU, V-phase coil MV, and a W-phase coil MW, which will be described later. In the present embodiment, the coils MU, MV, and MW are connected using a star connection, but there is no limitation thereto, and a delta connection may also be used. The motor driving system MMC includes a motor control unit MCU and a power supply portion PS.

The motor control unit MCU includes a logic circuit (not shown). Based on information regarding the position of a rotor, which is acquired from the motor M, the motor control unit MCU generates electricity supply control signals for respective phases to control electricity supply to the coils of respective phases (U-phase, V-phase, and W-phase) of the motor M at appropriate timings. Also, the motor control unit MCU changes an excited phase switching timing when the rotation direction of the motor M is switched and when the rotational speed of the motor M is changed, for example.

The power supply portion PS supplies driving power (electric current) to the coils of respective phases of the motor M at timings based on the electricity supply control signals for respective phases, which are received from the motor control unit MCU.

Figure 2:
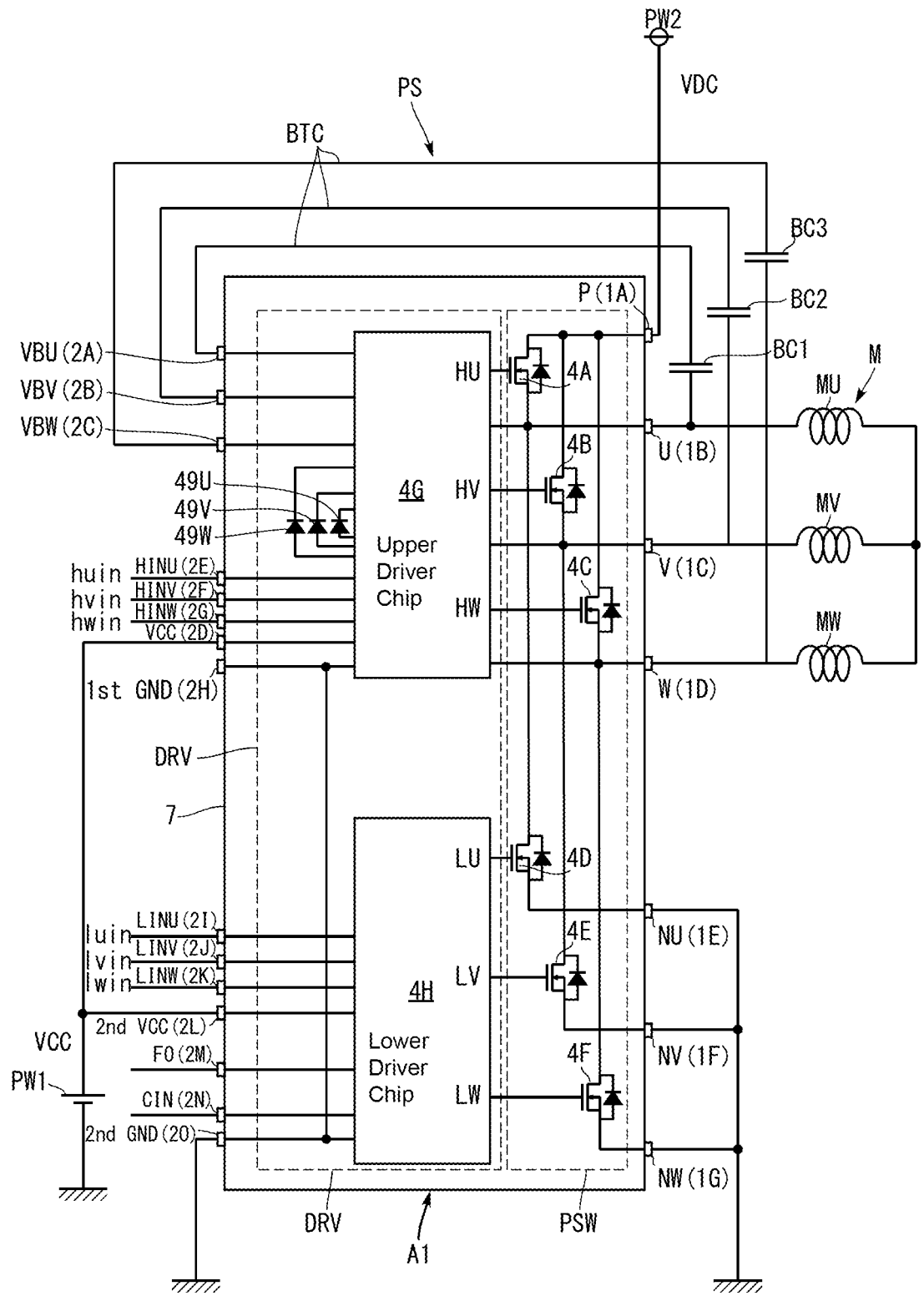
FIG. 2 is a block diagram of a power supply portion that includes the switch driving device according to the first embodiment.

FIG. 2 is a block diagram of the power supply portion PS that includes the switch driving device according to the first embodiment. As shown in FIGS. 1 and 2, the power supply portion PS includes a switch driving device A1 and bootstrap circuits BTC. The switch driving device A1 includes a driver circuit DRV and a power switch circuit PSW.

As shown in FIG. 2, in the switch driving device A1, the driver circuit DRV, the power switch circuit PSW, and diodes 49U, 49V, and 49W that constitute the bootstrap circuits BTC are included in a single resin package 7. Although the boot diodes 49U, 49V, and 49W are included in the package 7 in the present embodiment, there is no limitation to this configuration, and the boot diodes may also be provided outside the package 7.

As shown in FIG. 2, the power supply portion PS is connected to a first power source PW1 and a second power source PW2. The first power source PW1 supplies a control voltage VCC (e.g., 10 V to 25 V) for controlling the driver circuit DRV. The second power source PW2 supplies a drive voltage VDC (300 V, 600 V, etc.) for driving the motor M.

The power switch circuit PSW includes six transistors 4A to 4F (switch elements). Power MOSFETs are employed as the six transistors 4A to 4F, for example. Silicon carbide (SiC) can be used as a semiconductor substrate on which the power MOSFETs are made, for example. In the present embodiment, the transistors 4A to 4F are SiC-MOSFETs. Note that all of the transistors 4A to 4F are N-type MOSFETs.

In the power switch circuit PSW, the source of the transistor 4A and the drain of the transistor 4D are connected to each other. The drain of the transistor 4A is connected to the second power source PW2. The source of the transistor 4D is connected to a grounding point. Note that the transistor 4D may also be connected to the grounding point via a resistor for detecting a current. The U-phase coil MU of the motor M is connected to a connection point between the source of the transistor 4A and the drain of the transistor 4D.

The transistor 4B and the transistor 4E are connected to each other in the same manner as the transistor 4A and the transistor 4D. The V-phase coil MV of the motor M is connected to a connection point between the source of the transistor 4B and the drain of the transistor 4E. The transistor 4C and the transistor 4F are connected to each other in the same manner as the transistor 4A and the transistor 4D. The W-phase coil MW of the motor M is connected to a connection point between the source of the transistor 4C and the drain of the transistor 4F.

In the present disclosure, the transistors 4A, 4B, and 4C on the second power source PW2 side of the power switch circuit PSW will be referred to as "upper transistors" ("upper switch elements") and the transistors 4D, 4E, and 4F on the grounding point side will be referred to as "lower transistors" ("lower switch elements").

The driver circuit DRV includes an upper driver chip 4G and a lower driver chip 4H. The upper driver chip 4G is connected to the gates of the upper transistors 4A, 4B, and 4C and includes a circuit for outputting drive signals HU, HV, and HW to the gates of the upper transistors 4A, 4B, and 4C, respectively. The upper transistors 4A, 4B, and 4C are turned ON when voltage levels of the drive signals HU, HV, HW are at an H level. The lower driver chip 4H is connected to the gates of the lower transistors 4D, 4E, and 4F and includes a circuit for inputting drive signals LU, LV, and LW to the gates of the lower transistors 4D, 4E, and 4F, respectively. The lower transistors 4D, 4E, and 4F are turned ON when voltage levels of the drive signals LU, LV, and LW are at the H level. The voltage level being at the H level indicates a state in which the voltage is higher than a voltage that is determined in advance. The voltage level being at an L level indicates a state in which the voltage is lower than a voltage that is determined in advance.

If the transistors 4A and 4E are turned ON and the other transistors are turned OFF, for example, the drive voltage VDC of the second power source PW2 is applied to the U-phase coil MU and the V-phase coil MV. Namely, a current flows from the U-phase coil MU toward the V-phase coil MV. Timings at which the transistors 4A to 4F are turned ON or OFF are switched using drive signals input from the driver circuit DRV as described above. Thus, a current is passed through the coils MU, MV, and MW of respective phases at desired timings to excite the coils and rotationally drive the motor M.

As shown in FIG. 2, the upper driver chip 4G and the lower driver chip 4H operate while being supplied with the control voltage VCC from the first power source PW1. The upper driver chip 4G and the lower driver chip 4H are connected to the motor control unit MCU, and electricity supply control signals huin, hvin, hwin, luin, lvin, and lwin are input from the motor control unit MCU to the upper driver chip 4G and the lower driver chip 4H. The electricity supply control signals huin, hvin, hwin, luin, lvin, and lwin are signals for controlling electricity supply to the transistors 4A to 4F. The electricity supply control signals huin, hvin, and hwin are input to the upper driver chip 4G and the electricity supply control signals luin, lvin, and lwin are input to the lower driver chip 4H.

The driver circuit DRV inputs the drive signal HU to the gate of the transistor 4A and inputs the drive signal LU to the gate of the transistor 4D. Similarly, the driver circuit DRV inputs the drive signal HV to the gate of the transistor 4B and inputs the drive signal LV to the gate of the transistor 4E. The driver circuit DRV inputs the drive signal HW to the gate of the transistor 4C and inputs the drive signal LW to the gate of the transistor 4F.

The bootstrap circuits BTC are circuits for supplying the upper driver chip 4G with voltages that are necessary to drive the upper transistors 4A, 4B, and 4C. For example, a bootstrap circuit connects the first power source PW1 to the source of the upper transistor 4A, and the boot diode 49U and a boot capacitor BC1 are connected in series in this order from the first power source PW1 side. The upper driver chip 4G acquires a voltage of a connection point between the boot diode 49U and the boot capacitor BC1 as a voltage that is necessary to drive the upper transistor 4A. In the bootstrap circuit BTC, a resistor for generating a current of a predetermined current value may also be arranged between the first power source PW1 and the boot diode 49U.

A bootstrap circuit BTC includes the boot diode 49V and a boot capacitor BC2 that correspond to the upper transistor 4B, and the upper driver chip 4G acquires a voltage that is necessary for driving. A bootstrap circuit BTC includes the boot diode 49W and a boot capacitor BC3 that correspond to the upper transistor 4C, and the upper driver chip 4G acquires a voltage that is necessary for driving.

Next, details of the driver circuit will be further described. The driver circuit DRV of the switch driving device A1 includes a circuit for driving the transistors 4A and 4D, a circuit for driving the transistors 4B and 4E, and a circuit for driving the transistors 4C and 4F. These circuits for driving the transistors have the same configuration. Therefore, the following describes a circuit portion that drives the transistors 4A and 4D, as the driver circuit DRV. A circuit that includes the boot diode 49U and the boot capacitor BC1 that correspond to the transistor 4A will be described as a bootstrap circuit BTC. The transistor 4A will be referred to as an "upper transistor 4A", and the transistor 4D will be referred to as a "lower transistor 4D". A connection point between the source of the upper transistor 4A and the drain of the lower transistor 4D will be referred to as a "first point P1", and a connection point between the cathode of the boot diode 49U and the boot capacitor BC1 in the bootstrap circuit BTC will be referred to as a "second point P2".

Figure 3:
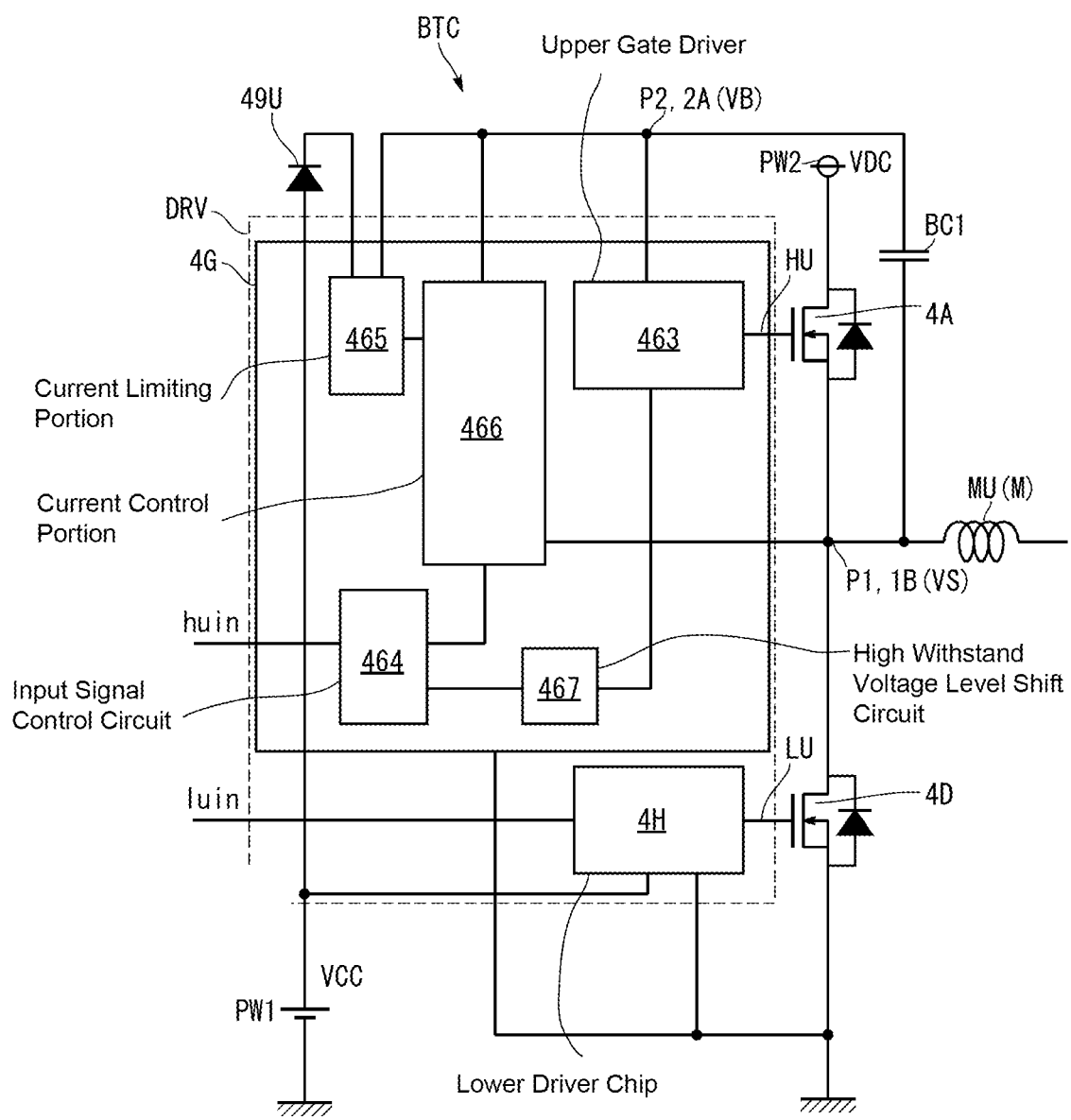
FIG. 3 is a block diagram showing a schematic configuration of a driver circuit of the switch driving device according to the first embodiment.

FIG. 3 is a block diagram showing a schematic configuration of the driver circuit. The driver circuit DRV shown in FIG. 3 includes the upper driver chip 4G and the lower driver chip 4H. In the switch driving device A1, the lower driver chip 4H has the same configuration as driver circuits that are used in conventionally known switch driving devices. Therefore, a detailed description of the configuration and operations of the lower driver chip 4H will be omitted.

As shown in FIG. 3, the upper driver chip 4G includes an upper gate driver 463, an input signal control circuit 464, a current limiting portion 465, a current control portion 466, and a high withstand voltage level shift circuit 467.

The input signal control circuit 464 inputs an electricity supply control signal (here, huin) output from the motor control unit MCU to the upper gate driver 463 via the high withstand voltage level shift circuit 467.

The upper gate driver 463 generates the drive signal HU for driving the upper transistor 4A, based on the signal input from the input signal control circuit 464, and outputs the drive signal HU to the gate of the upper transistor 4A.

The upper gate driver 463 acquires a voltage that is necessary to drive the upper transistor 4A from the bootstrap circuit BTC constituted by the boot diode 49U and the boot capacitor BC1. The bootstrap circuit BTC charges the boot capacitor BC1 using a current supplied from the first power source PW1. Both ends of the boot capacitor BC1 are charged to a voltage that is equal to or higher than a gate threshold voltage, for example. With this configuration, a voltage VB of the second point P2 can be made higher than a voltage VS of the first point P1 by an amount equal to the charging voltage of the boot capacitor BC1, regardless of the voltage VS of the first point P1. As a result of the upper gate driver 463 acquiring the voltage VB of the second point P2, a voltage necessary to drive the upper transistor 4A can be acquired.

The current limiting portion 465 is provided on a circuit that connects the first power source PW1 to the boot capacitor BC1. In the present embodiment, the current limiting portion 465 is provided between the cathode of the boot diode 49U and the boot capacitor BC1. The current limiting portion 465 limits a current to be supplied from the first power source PW1 to the boot capacitor BC1, based on a signal (current limit signal) output from the current control portion 466. Thus, the voltage (charging voltage) between both ends of the boot capacitor BC1 is adjusted (limited) by the current limiting portion 465. Details of the configuration of the current limiting portion 465 will be described later.

Figure 4:
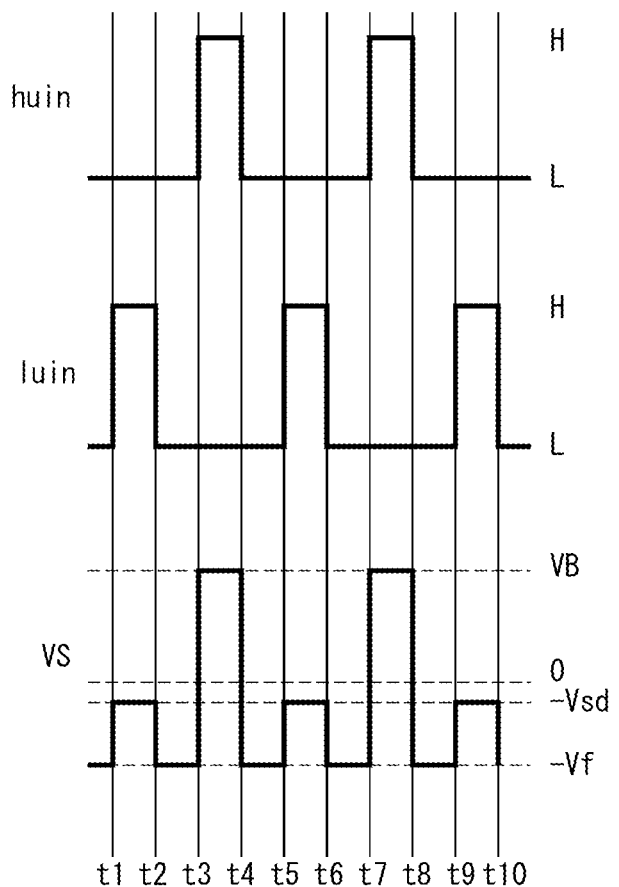
FIG. 4 is a timing chart showing output operations of the switch driving device according to the first embodiment.

Operations of the switch driving device A1 will be described with reference to FIG. 4. FIG. 4 is a timing chart showing output operations (behavior in a mode 2 described later) of the switch driving device A1 in the U phase, and the electricity supply control signals huin and luin and the voltage VS are shown in this order from the top. In this drawing, Vsd represents a voltage between the source and the drain of the lower transistor 4D and Vf represents a forward voltage drop of a parasitic diode that accompanies the lower transistor 4D. Output operations in the V phase and the W phase are similar to those in the U phase and can be shown by replacing the electricity supply control signals huin and luin in this drawing with electricity supply control signals hvin and lvin and electricity supply control signals hwin and lwin, respectively. Note that a delay time is ignored in this drawing to simplify the description.

In the switch driving device A1, the upper transistor 4A and the lower transistor 4D are controlled to operate complementarily to each other. Control is performed such that the lower transistor 4D is turned OFF (luin=L) when the upper transistor 4A is turned ON (huin=H) as shown in periods between times t3 and t4 and times t7 and t8, and the upper transistor 4A is turned OFF (huin=L) when the lower transistor 4D is turned ON (luin=H) as shown in periods between times t1 and t2, times t5 and t6, and times t9 and t10. Note that, if a through current flows between the upper transistor 4A and the lower transistor 4D, this causes deterioration or damage to the transistors. Therefore, when a state in which the upper transistor 4A is turned ON is to be switched to a state in which the lower transistor 4D is turned ON, a dead time during which both of the upper transistor 4A and the lower transistor 4D are turned OFF (huin=luin=L) is set as shown in periods between times t2 and t3, times t4 and t5, times t6 and t7, and times t8 and t9.

In the switch driving device A1 operating as described above, a voltage is applied (i.e., a current is supplied) from the second power source PW2 to the U-phase coil MU, which is a load, by turning the upper transistor 4A ON and turning the lower transistor 4D OFF. At this time, the voltage VS of the first point P1 may be approximately the same (i.e., about 300 V) as the drive voltage VDC of the second power source PW2.

The bootstrap circuit BTC makes the voltage VB of the second point P2, to which the upper gate driver 463 is connected, higher than the voltage VS of the first point P1 by an amount equal to the voltage (hereinafter referred to as a "charging voltage VBS") between both ends of the boot capacitor BC1 achieved through charging. If the charging voltage of the boot capacitor BC1 is 18 V and the voltage VS of the first point P1 transitions from 0 V to 300 V, for example, the voltage VB of the second point P2 transitions from about 18 V to about 318 V.

As a result of the voltage VB being supplied from the second point P2 to the upper gate driver 463, the upper gate driver 463 can always acquire a voltage with which the upper transistor 4A can be driven. In this case, the boot capacitor BC1 serves as a floating power supply. The boot capacitor BC1 is configured to be capable of being charged to a voltage that is higher than the gate threshold voltage.

The following describes charging of the boot capacitor BC1. First, the following describes a case in which the current limiting portion 465 is not provided unlike the switch driving device A1 according to the present disclosure. In the switch driving device A1, a case in which a motor current flows in a forward direction of the lower transistor 4D will be referred to as a "mode 1", and a case in which a body diode of the lower transistor 4D is turned ON (at the time of downward regeneration) will be referred to as a "mode 2". The boot capacitor BC1 is charged in the mode 1 and the mode 2.

In the mode 1, a motor current IM that flows from a neutral point of the motor M via the first point P1 and the lower transistor 4D toward a grounding end passes through the U-phase coil MU. At this time, the voltage VS of the first point P1 is the same or approximately the same as the voltage (0 V) of the grounding point. Actually, the voltage VS is higher than 0 V by IM×R due to the presence of a resistance component R derived from ON-resistance of the lower transistor 4D or a current detection resistor. Therefore, the voltage between both ends of the boot capacitor BC1 is approximately the same as the control voltage VCC of the first power source PW1, and the boot capacitor BC1 is charged to the voltage VCC in this state. To be more exact, when VBS represents the charging voltage of the boot capacitor BC1, VFBOOT represents a forward voltage drop of the boot diode 49U, Ron represents the value of ON-resistance of the lower transistor 4D, and IM represents the motor current, VBS=VCC−VFBOOT−Ron×IM. In the mode 1, charging is performed if the voltage VB of the second point P2 is equal to or lower than the above-described charging voltage VBS.

Next, the mode 2 will be described. As shown in FIG. 3, the upper transistor 4A and the lower transistor 4D include parasitic diodes (body diodes). A forward voltage drop of the parasitic diode of the lower transistor 4D will be represented by Vf. When the motor M performs a regenerative operation in the mode 2, a motor current passes through the U-phase coil MU while flowing from the first point P1 toward the neutral point. At this time, a current does not flow from the second power source PW2 because the upper transistor 4A is turned OFF. The lower transistor 4D is turned OFF, but a current flows via the parasitic diode. Accordingly, the voltage VS of the first point P1 becomes −Vf, which is lower than the ground voltage. As a result, the voltage between both ends of the boot capacitor BC1 becomes approximately VCC+Vf. To be exact, the boot capacitor is charged to a voltage VBS=VCC−VFBOOT+Vf. As described above, the charging voltage VBS of the boot capacitor BC1 is higher in the mode 2 than in the mode 1.

The voltage (VCC+Vf) between both ends of the boot capacitor BC1 may become higher than an allowable voltage (hereinafter referred to as an "allowable gate voltage") between the gate and the source of the upper transistor 4A. If the voltage (VCC+Vf) between both ends of the boot capacitor BC1 becomes higher than the allowable gate voltage, this may cause deterioration or damage to the upper transistor 4A. In the present disclosure, an excessively charged state means a state in which the boot capacitor BC1 is charged to have a charging voltage VBS that is higher than the allowable gate voltage of the upper transistor 4A, for example. An excessively charged state is likely to occur particularly in the case of an SiC-based transistor, because the forward voltage drop Vf of a parasitic diode accompanying the SiC-based transistor is large.

In the switch driving device A1 according to the present embodiment, the upper driver chip 4G includes the current limiting portion 465 in a circuit between the boot diode 49U and the boot capacitor BC1. The current limiting portion 465 limits a current to be supplied to the boot capacitor BC1 such that the boot capacitor BC1 will not be excessively charged.

Figure 5:
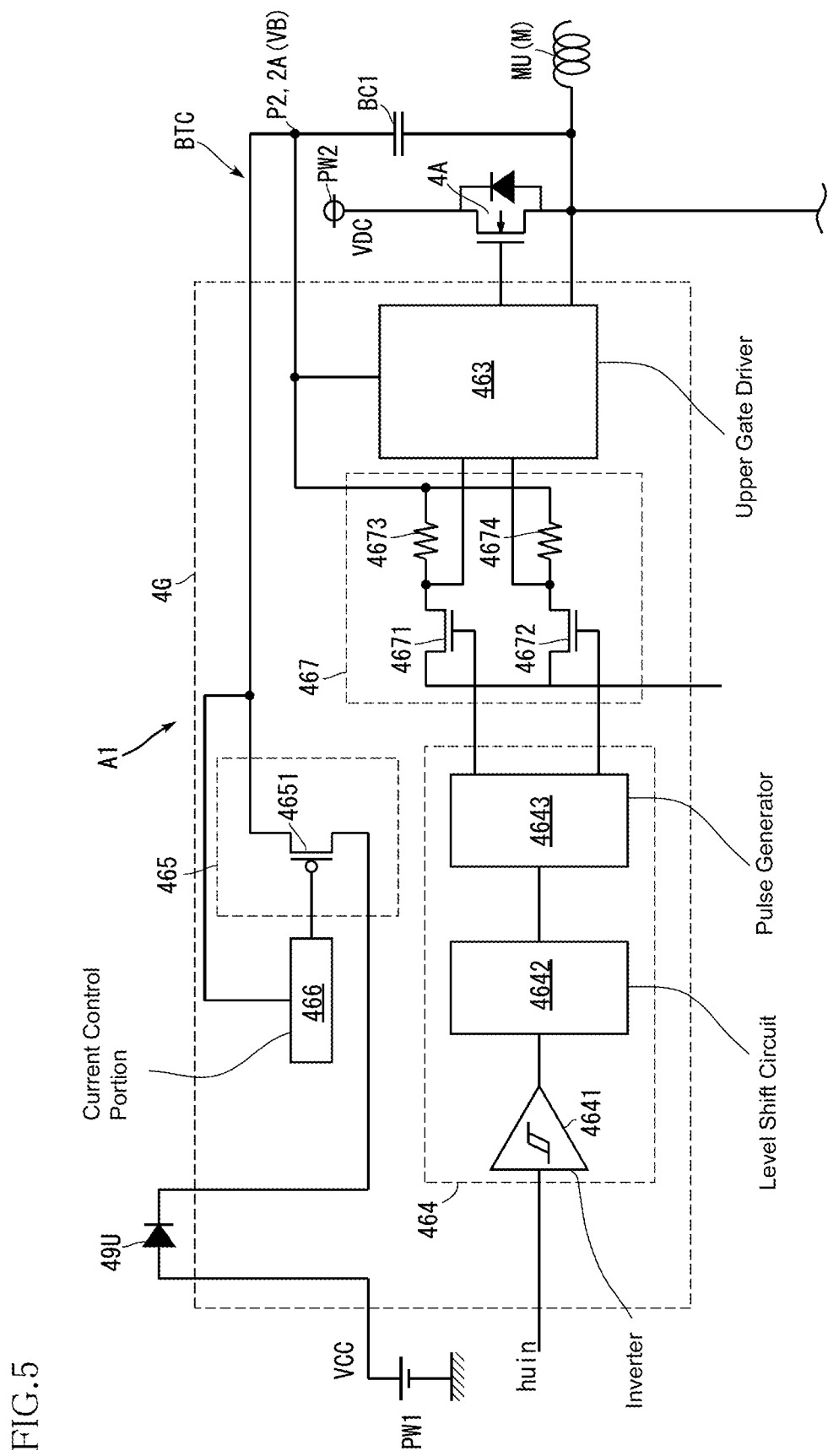
FIG. 5 is a circuit diagram showing one example of an upper driver circuit of the switch driving device according to the first embodiment.

Next, the upper driver chip 4G will be described. FIG. 5 is a circuit diagram of one example of the upper driver chip 4G used in the switch driving device A1. As described above, an excessively charged state of the boot capacitor BC1 occurs as a result of the voltage (VCC+Vf) between both ends of the boot capacitor BC1 becoming excessively high. If the control voltage VCC of the first power source PW1 connected to the boot capacitor BC1 is high, the boot capacitor BC1 is more likely to be excessively charged, when compared to a case in which the voltage VCC is low. Therefore, in the switch driving device A1, the upper driver chip 4G has a configuration for keeping the boot capacitor BC1 from being excessively charged even if a power source of a different voltage is connected.

Next, details of the upper driver chip 4G will be described. As shown in FIG. 5, the upper driver chip 4G includes the upper gate driver 463, the input signal control circuit 464, the current limiting portion 465, the current control portion 466, and the high withstand voltage level shift circuit 467. The current control portion 466 transmits a signal to the current limiting portion 465 to drive the current limiting portion 465 and cause a voltage drop between the boot diode 49U and the boot capacitor BC1 to reduce the voltage when the boot capacitor BC1 is being charged. In other words, the current limiting portion 465 limits a current used to charge the boot capacitor BC1.

The electricity supply control signal huin is input from the motor control unit MCU (see FIG. 1, for example) to the input signal control circuit 464. As shown in FIG. 5, the input signal control circuit 464 includes an inverter (Schmitt buffer) 4641 that converts the electricity supply control signal huin to an L signal or an H signal. Also, the input signal control circuit 464 includes a level shift circuit 4642 and a pulse generator 4643. The level shift circuit 4642 has a function of increasing the voltage level of a signal output from the inverter 4641. This facilitates handling of the signal in the upper driver chip 4G. The pulse generator 4643 has a function of outputting a set pulse signal and a reset pulse signal based on a signal output from the level shift circuit 4642.

Figure 15:
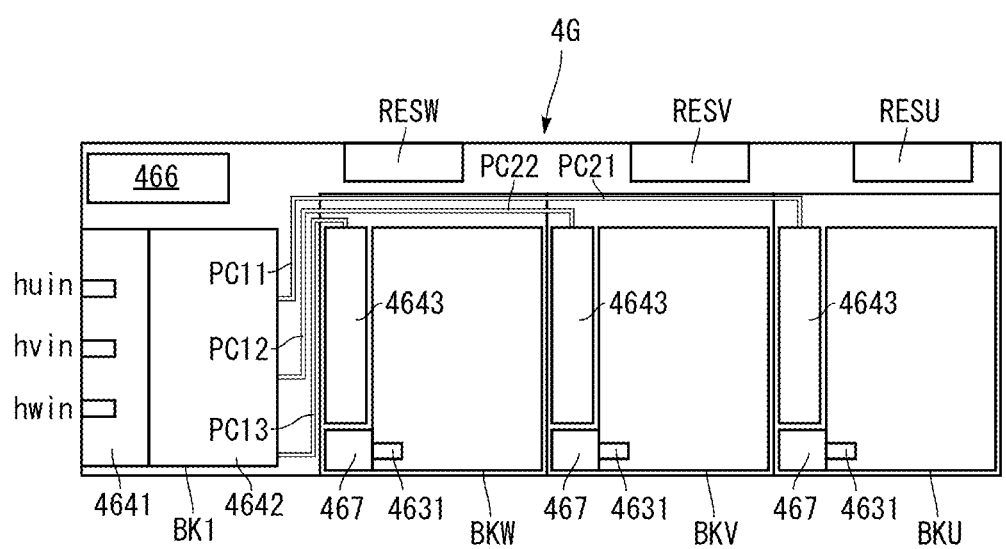
FIG. 15 is a schematic diagram showing a schematic configuration of an integrated circuit that constitutes the upper driver circuit of the switch driving device according to the first embodiment.

The set pulse signal and the reset pulse signal output from the pulse generator 4643 are input to the high withstand voltage level shift circuit 467. The high withstand voltage level shift circuit 467 includes a transistor 4671, a transistor 4672, a resistor 4673, and a resistor 4674. The transistor 4671 and the transistor 4672 are N-type MOSFETs that are high withstand voltage transistors. The drain of the transistor 4671 is connected via the resistor 4673 to the second point P2 or a point that has the same potential as the second point P2. The source of the transistor 4671 is connected via a resistor (not shown) to a grounding point, and a pulse signal is input from the pulse generator 4643 to the gate of the transistor 4671. The drain of the transistor 4672 is connected via the resistor 4674 to the second point P2 or a point that has the same potential as the second point P2. The source of the transistor 4672 is connected via a resistor (not shown) to a grounding point, and a pulse signal is input from the pulse generator 4643 to the gate of the transistor 4672. A circuit that includes the transistor 4671 and the resistor 4673 (=a circuit that outputs a set pulse signal) and a circuit that includes the transistor 4672 and the resistor 4674 (=a circuit that outputs a reset pulse signal) are arranged such that signal lines of the respective circuits are symmetrical to each other. A connection point between the drain of the transistor 4671 and the resistor 4673 and a connection point between the drain of the transistor 4672 and the resistor 4674 are each connected to a clamping circuit (see FIG. 15) that limits the level of a signal to be input to an inverter (not shown) that forms an input stage of the upper gate driver 463 to a value not larger than a predetermined value.

In the high withstand voltage level shift circuit 467, signal lines for the set pulse signal and the reset pulse signal are arranged symmetrically to each other. For example, the length (e.g., length of a set pulse signal wire) from the connection point between the drain of the transistor 4671 and the resistor 4673 to the clamping circuit 4631 and the length (e.g., length of a reset pulse signal wire) from the connection point between the drain of the transistor 4672 and the resistor 4674 to the clamping circuit 4631 are the same or approximately the same. Elements of the pair of the transistor 4671 and the resistor 4673 are also arranged symmetrically to elements of the pair of the transistor 4672 and the resistor 4674. Thus, wiring resistance and parasitic capacitance are made equal between these wires to suppress a gap between signals transmitted through the wires.

The current limiting portion 465 includes a transistor 4651. The transistor 4651 is arranged on a path that connects the boot diode 49U to the boot capacitor BC1 and is located in a region that has the same potential as the boot capacitor BC1, which is a floating power supply. The transistor 4651 is a P-type MOSFET. The source of the transistor 4651 is connected to the cathode of the boot diode 49U. The drain of the transistor 4651 is connected to the boot capacitor BC1. A signal is input from the current control portion 466 to the gate of the transistor 4651.

The current control portion 466 detects the voltage VB of the second point P2. Also, the current control portion 466 compares the detected voltage VB to a threshold voltage that is set in advance. If the voltage VB is at least the threshold voltage, the current control portion 466 outputs an H level signal to the gate of the transistor 4651. As a result, the transistor 4651 is turned OFF. On the other hand, if the voltage VB is lower than the threshold voltage, the current control portion 466 outputs an L level signal to the gate of the transistor 4651. As a result, the transistor 4651 is turned ON. The current control portion 466 can be realized by changing a threshold voltage of a conventionally known OVLO circuit, for example, and a detailed description of the current control portion 466 is omitted.

If the voltage VB is at least the threshold voltage, the transistor 4651 is turned OFF based on a signal input from the current control portion 466. As a result, the conduction path between the boot diode 49U and the boot capacitor BC1 is interrupted. On the other hand, if the voltage VB is lower than the threshold voltage, the transistor 4651 is turned ON based on a signal input from the current control portion 466. As a result, the conduction path between the boot diode 49U and the boot capacitor BC1 is secured. Namely, if the voltage VB is at least the threshold voltage, the boot capacitor BC1 is not charged. To the contrary, if the voltage VB is lower than the threshold voltage, a current flows between the boot diode 49U and the boot capacitor BC1 and the boot capacitor BC1 is charged.

If the above-described configuration is employed, the boot capacitor BC1 can be kept from being charged more than necessary, and the occurrence of problems due to excessive charging of the boot diode BC1 can be suppressed.

FIGS. 6 to 13 show an example of the configuration of the switch driving device A1 according to the first embodiment. The illustrated switch driving device A1 includes a plurality of leads 1, a plurality of leads 2, a substrate 3, a plurality of transistors 4, a plurality of driver chips 4, a plurality of boot diodes 49, a conductive portion 5, a plurality of joining portions 6, a plurality of first wires 91, a plurality of second wires 92, and a package 7. The switch driving device A1 can be used for a drive circuit that drives a compressor of an outdoor unit of an air conditioner, a drive circuit that drives a compressor of a refrigerator, a drive circuit that drives a fan, etc. The drive circuit drives a three phase alternating current motor, for example.

Figure 6:
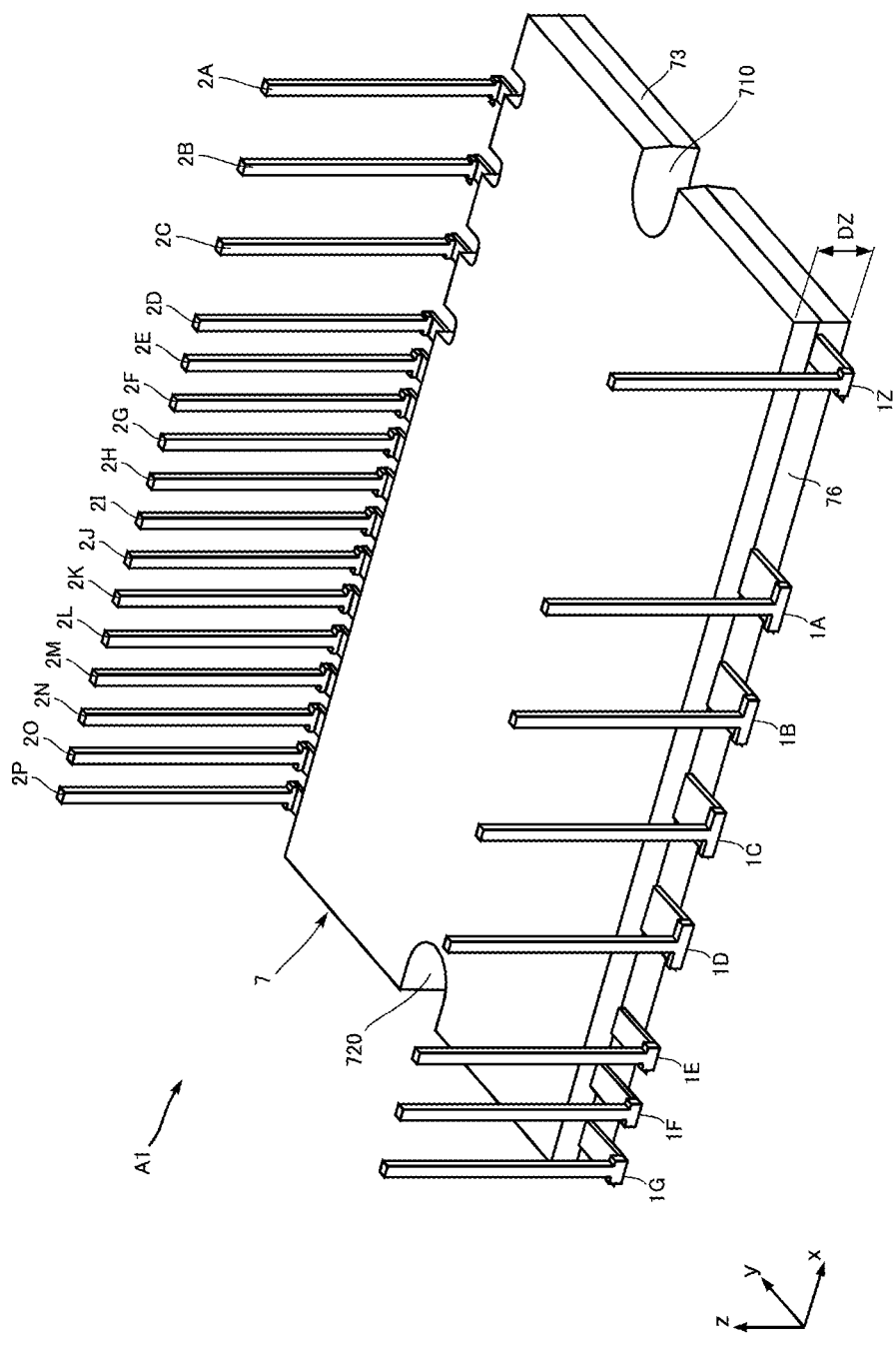
FIG. 6 is a perspective view showing the switch driving device according to the first embodiment.
Figure 7:
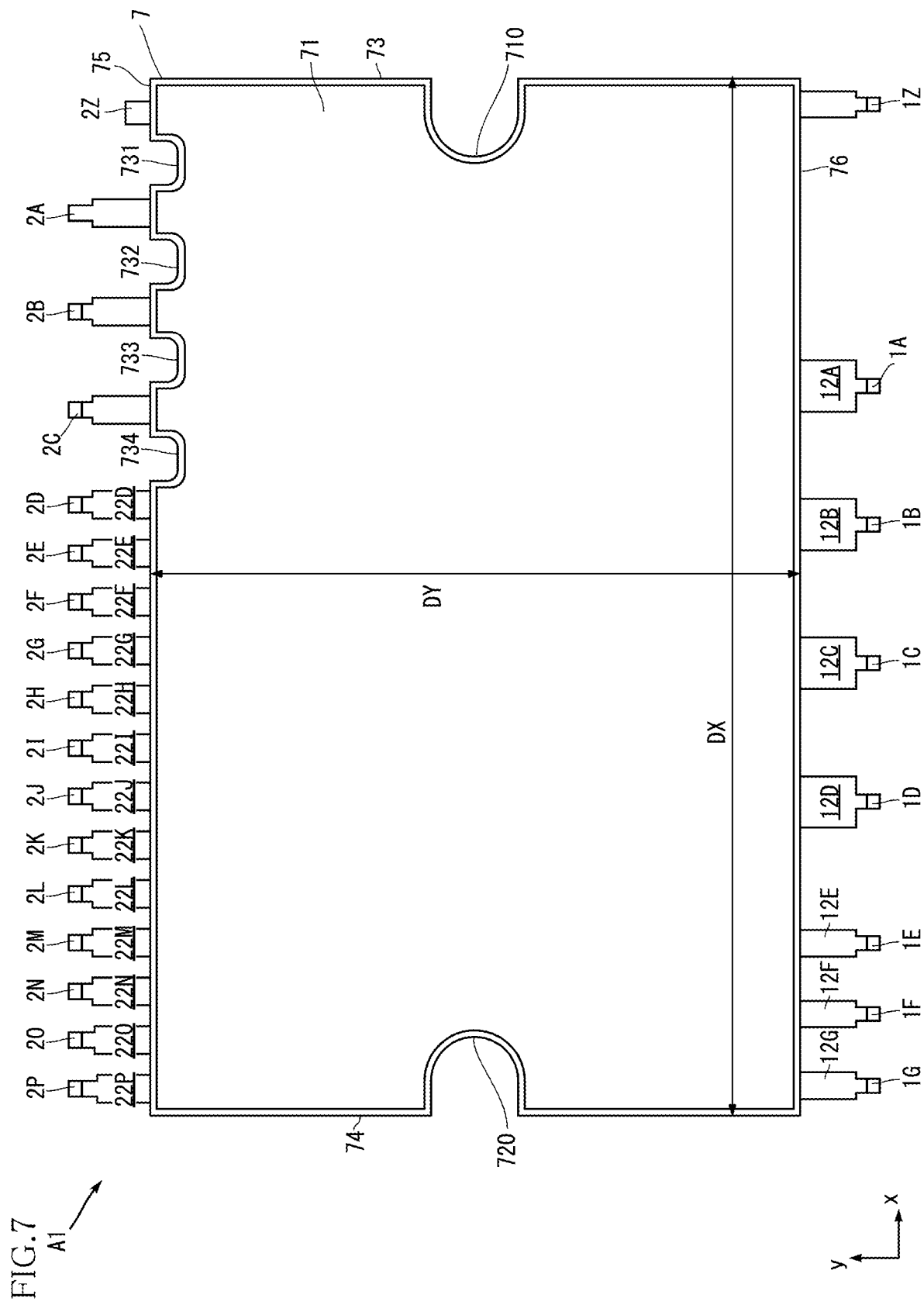
FIG. 7 is a plan view showing the switch driving device according to the first embodiment.
Figure 8:
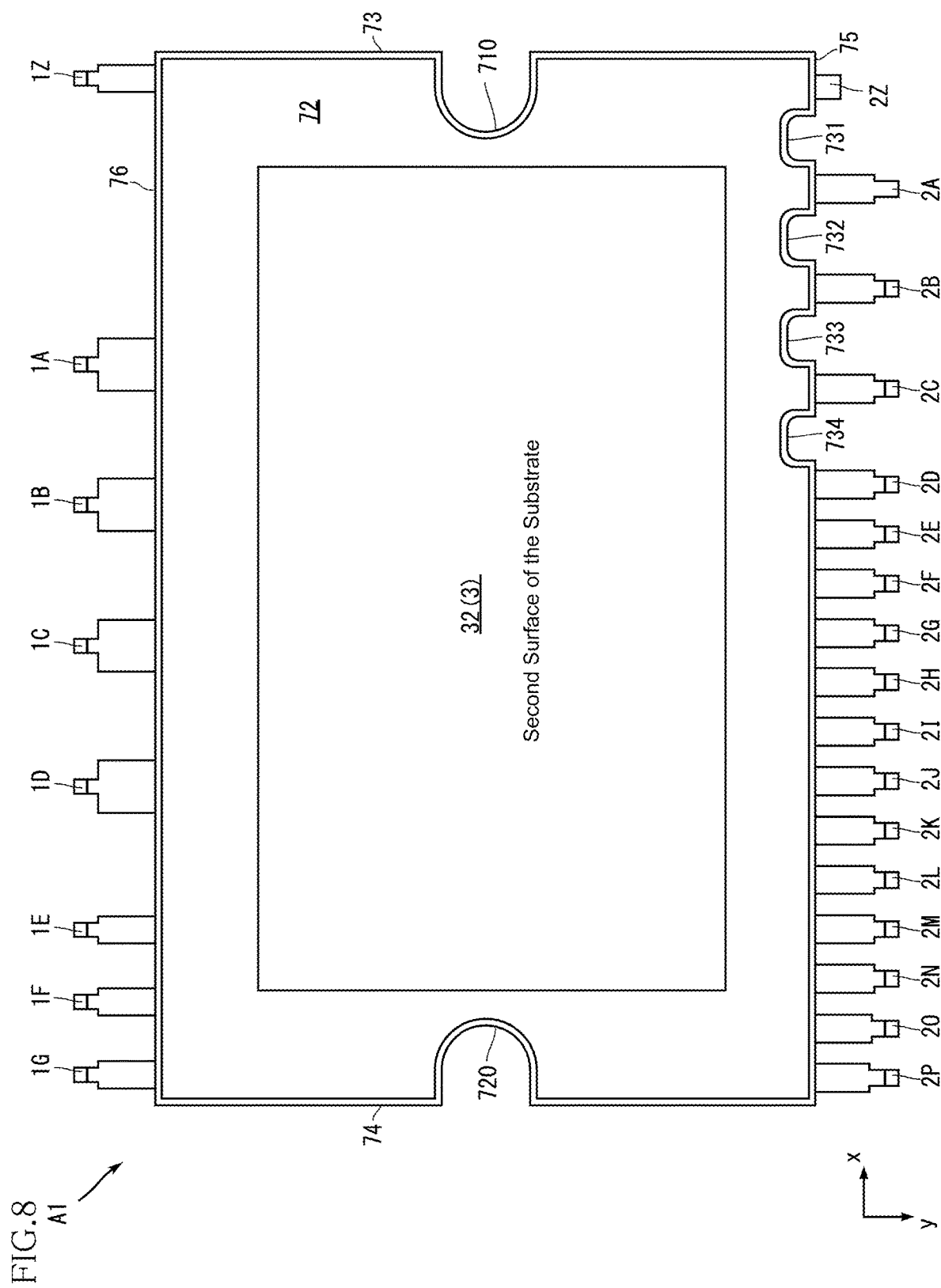
FIG. 8 is a bottom view showing the switch driving device according to the first embodiment.
Figure 9:
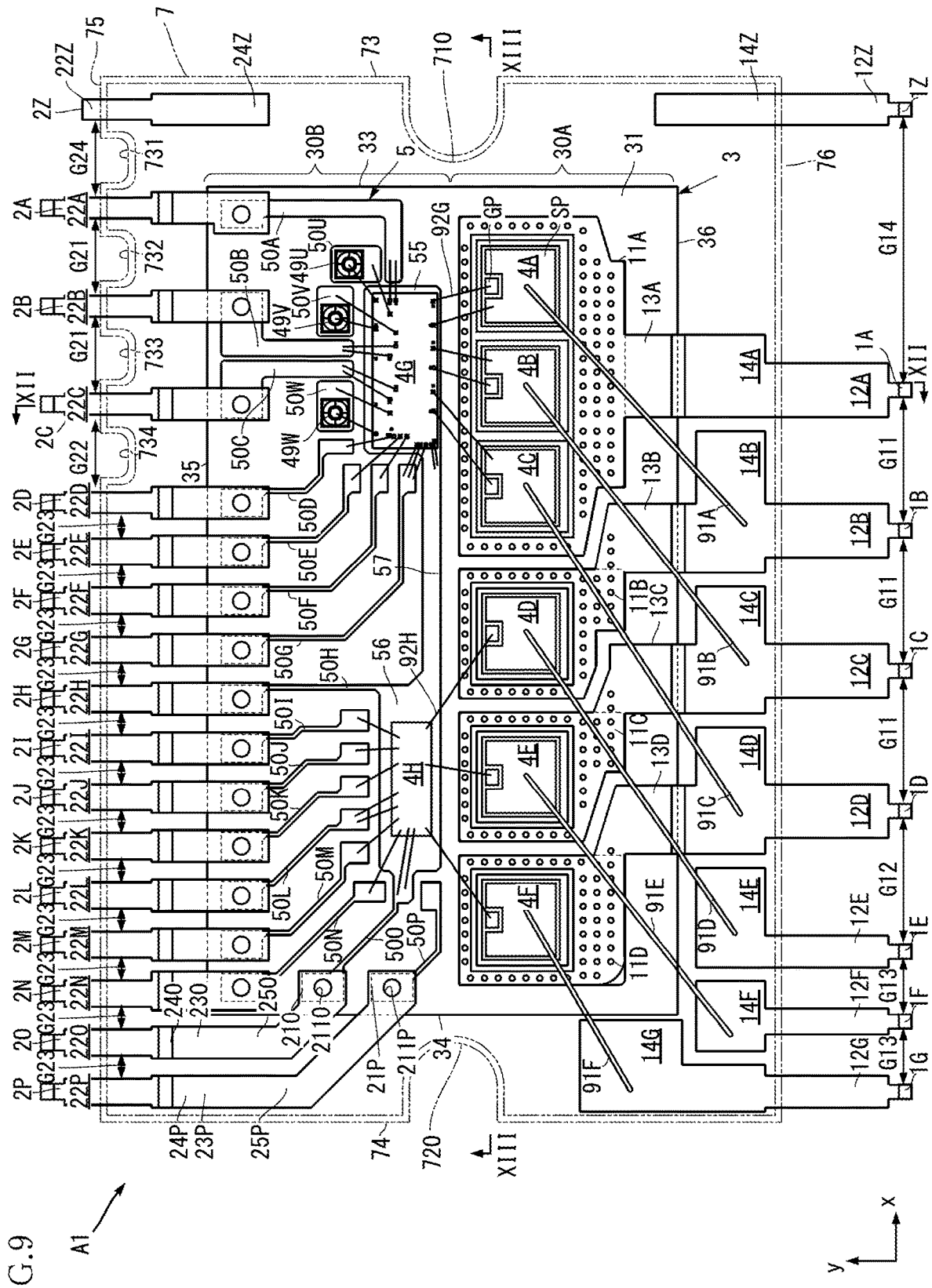
FIG. 9 is a plan view showing a main portion of the switch driving device according to the first embodiment.
Figure 10:
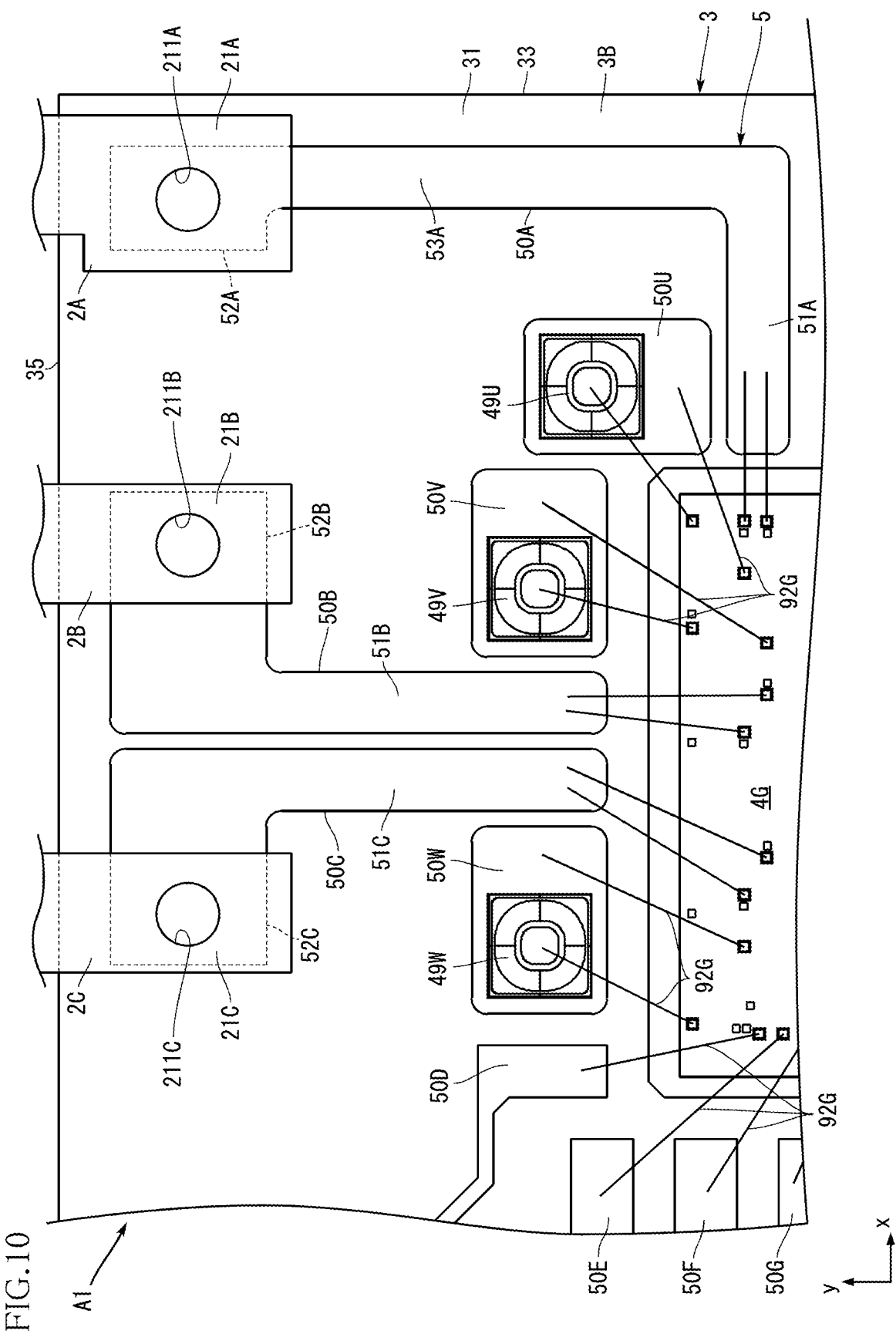
FIG. 10 is an enlarged plan view showing a main portion of the switch driving device according to the first embodiment.
Figure 11:
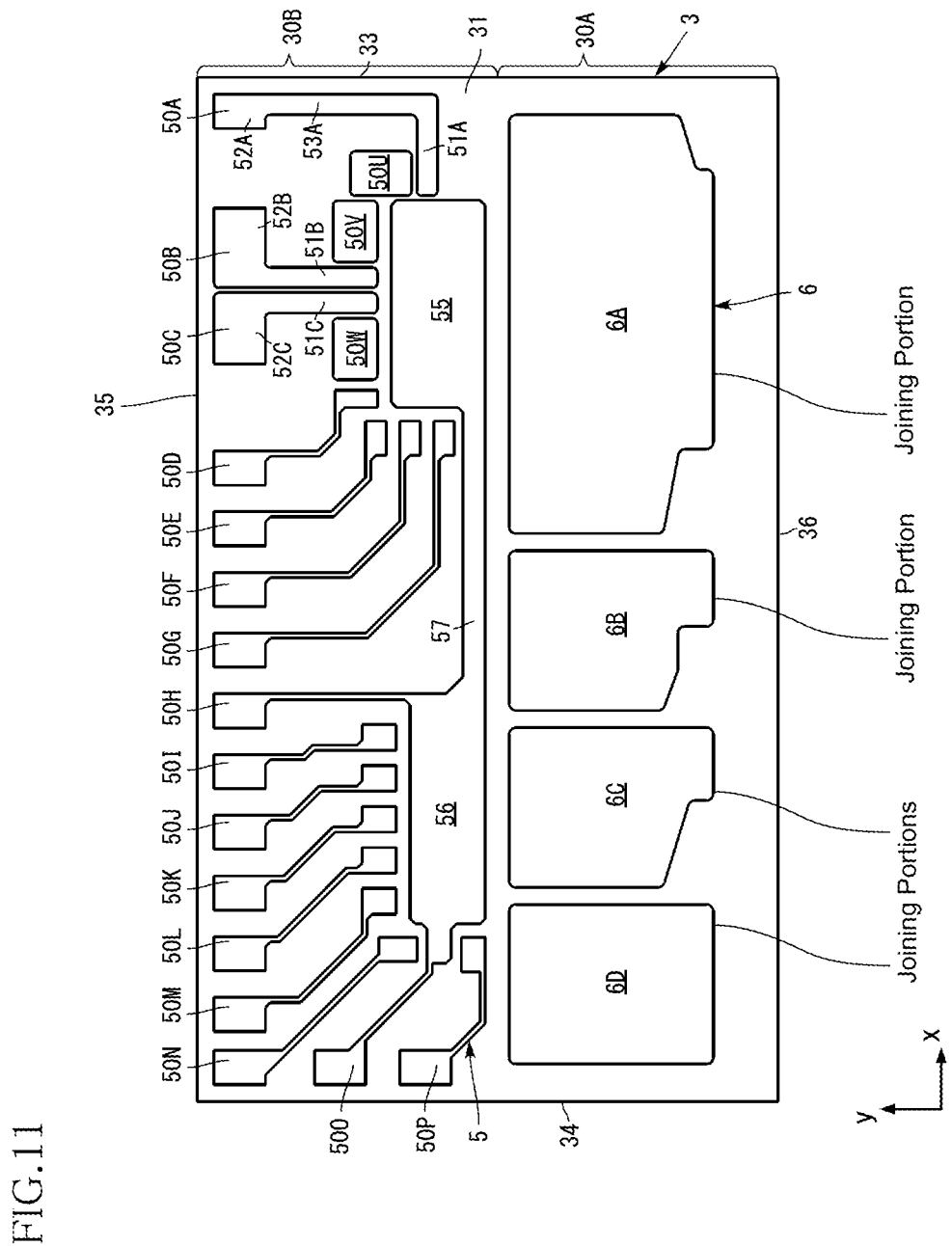
FIG. 11 is a plan view showing a substrate of the switch driving device according to the first embodiment.
Figure 12:
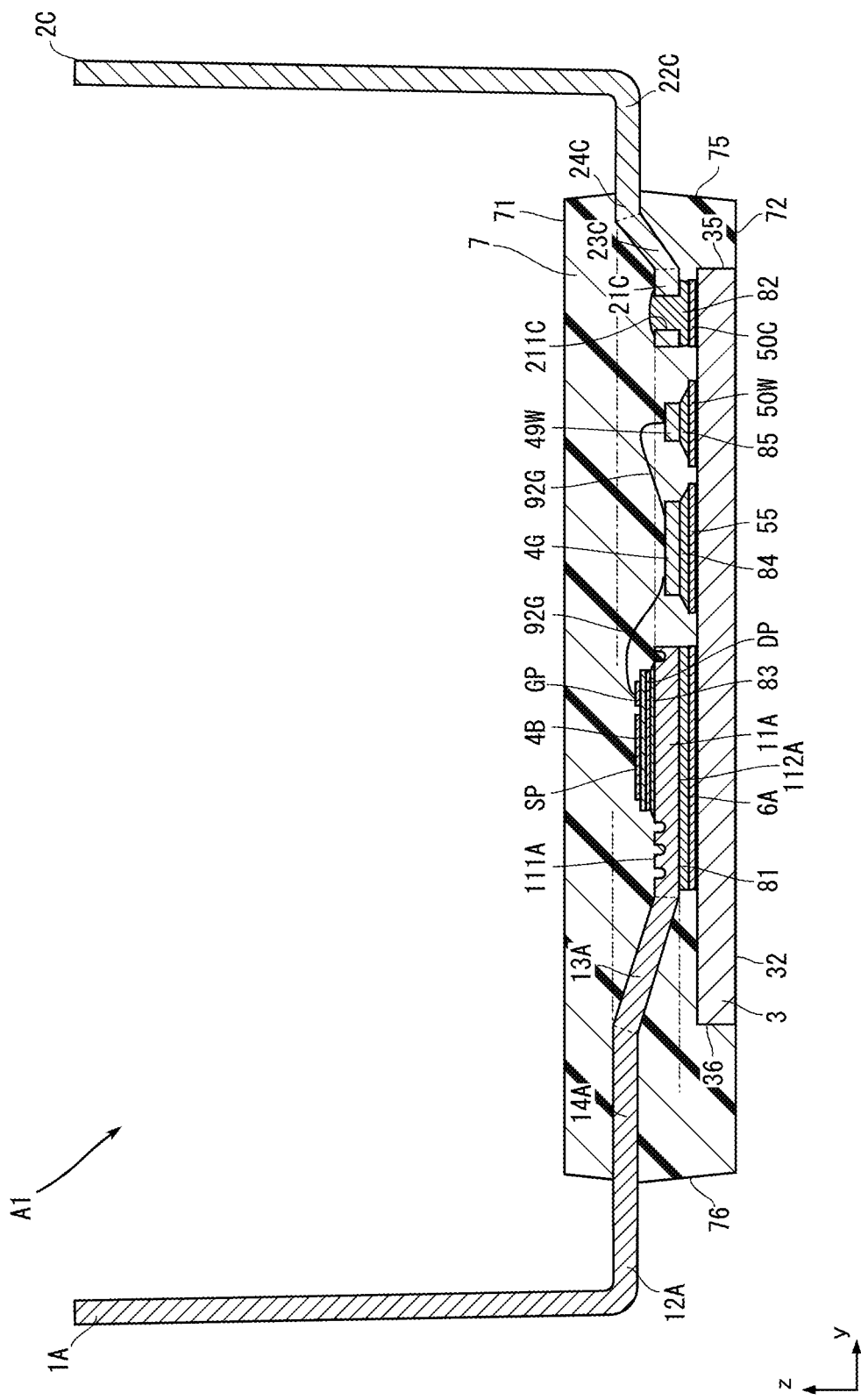
FIG. 12 is a cross-sectional view taken along line XII-XII in FIG. 9.
Figure 13:
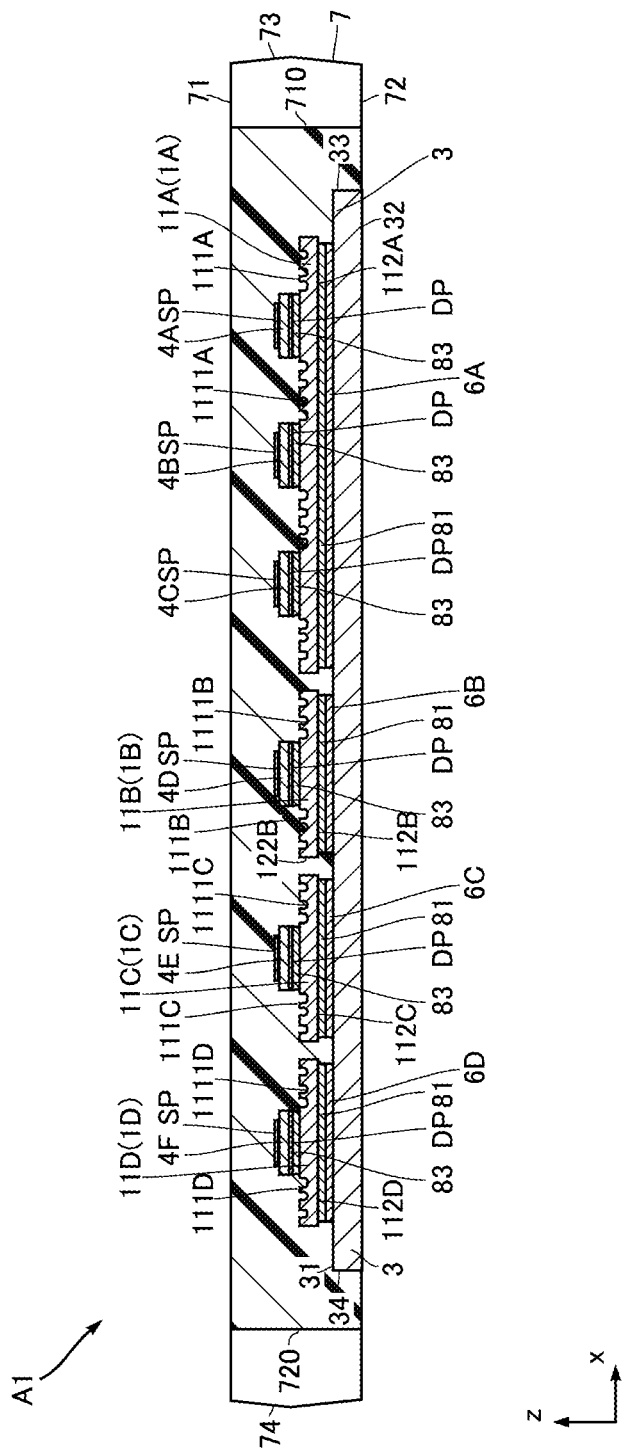
FIG. 13 is a cross-sectional view taken along line XIII-XIII in FIG. 9.
Figure 14:
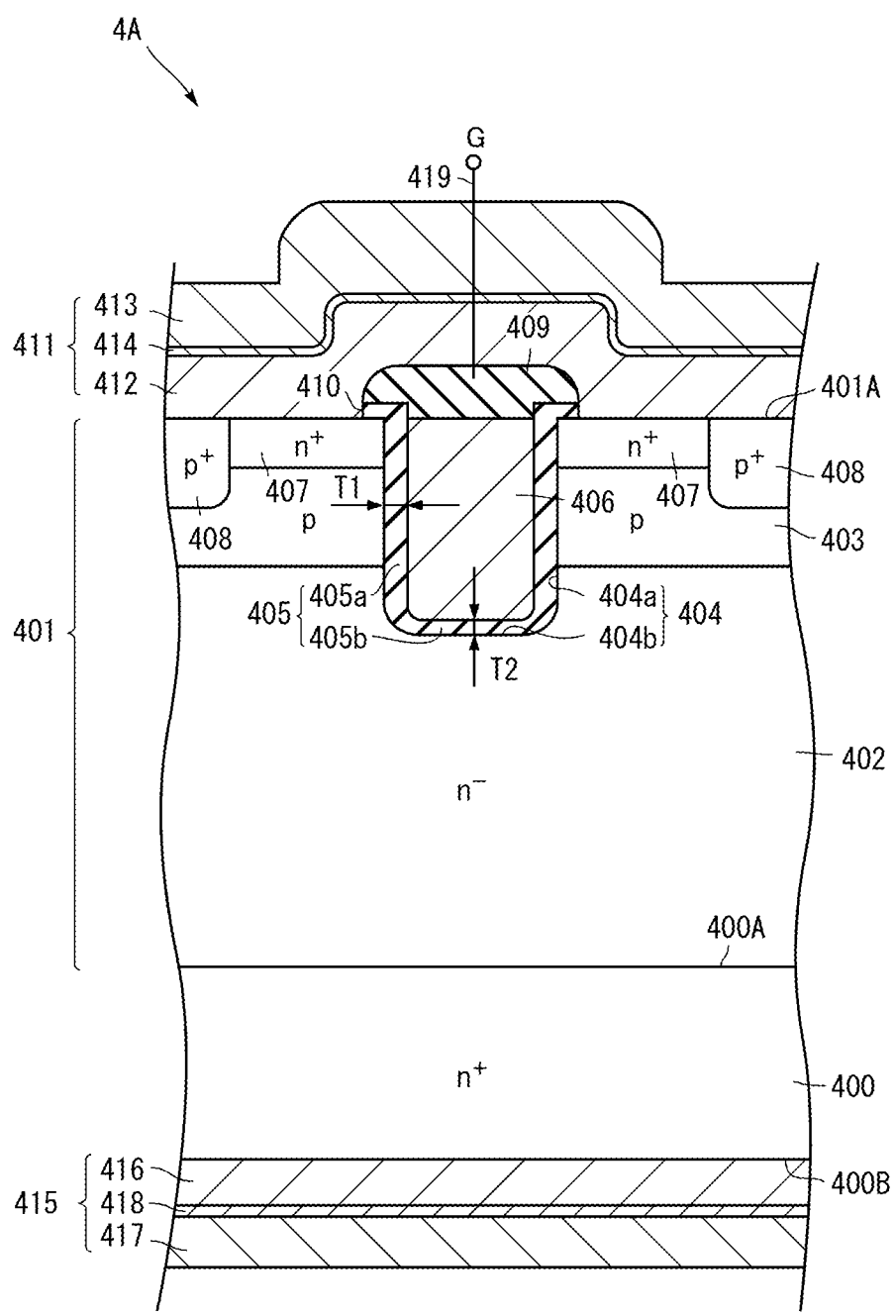
FIG. 14 is an enlarged cross-sectional view showing a main portion of a semiconductor chip of the switch driving device according to the first embodiment.

FIG. 6 is a perspective view showing the switch driving device A1. FIG. 7 is a plan view showing the switch driving device A1. FIG. 8 is a bottom view showing the switch driving device A1. FIG. 9 is a plan view showing a main portion of the switch driving device A1. FIG. 10 is an enlarged plan view showing a main portion of the switch driving device A1. FIG. 11 is an enlarged plan view showing a main portion of the substrate of the switch driving device A1. FIG. 12 is a cross-sectional view taken along line XII-XII in FIG. 9. FIG. 13 is a cross-sectional view taken along line XIII-XIII in FIG. 9. FIG. 14 is an enlarged cross-sectional view showing a main portion of a transistor of the switch driving device A1.

In these drawings, a z direction corresponds to a thickness direction of the substrate 3. An x direction (first direction) is perpendicular to the z direction. A y direction is perpendicular to the z direction and the x direction.

<Substrate 3>

The material that constitutes the substrate 3 is not specifically limited. A material that has a higher degree of thermal conductivity than the material of the package 7 is preferable as the material of the substrate 3, for example. Examples of the material of the substrate 3 include ceramics such as alumina ($Al_2O_3$), silicon nitride (SiN), aluminum nitride (AlN), alumina containing zirconia, etc. The thickness of the substrate 3 is not specifically limited, and is about 0.1 mm to about 1.0 mm, for example.

The shape of the substrate 3 is not specifically limited, and various shapes can be employed. In the example shown in FIGS. 9 to 13, the substrate 3 includes a first surface 31, a second surface 32, a third surface 33, a fourth surface 34, a fifth surface 35, and a sixth surface 36. The first surface 31 faces the z direction. The second surface 32 faces the side opposite to the first surface 31. The third surface 33 is located between the first surface 31 and the second surface 32 in the z direction and is continuous to the first surface 31 and the second surface 32. The third surface 33 faces the x direction. The fourth surface 34 is located between the first surface 31 and the second surface 32 in the z direction and is continuous to the first surface 31 and the second surface 32. The fourth surface 34 faces the side opposite to the third surface 33. The fifth surface 35 is located between the first surface 31 and the second surface 32 in the z direction and is continuous to the first surface 31 and the second surface 32. The fifth surface 35 faces the y direction. The sixth surface 36 is located between the first surface 31 and the second surface 32 in the z direction and is continuous to the first surface 31 and the second surface 32. The sixth surface 36 faces the side opposite to the fifth surface 35. In the illustrated example, the substrate 3 has a rectangular shape as viewed in the z direction. Also, the substrate 3 is elongated in the x direction as viewed in the z direction.

<Conductive Portion 5>

The conductive portion 5 is formed on the substrate 3. In the illustrated example, the conductive portion 5 is formed on the first surface 31 of the substrate 3. The conductive portion is made of an electrically conductive material. The electrically conductive material constituting the conductive portion 5 is not specifically limited, and examples of the electrically conductive material include silver (Ag), copper (Cu), gold (Au), etc. The following describes a case in which the conductive portion 5 contains silver. Alternatively, the conductive portion 5 may also contain Ag—Pt or Ag—Pd. The conductive portion 5 is formed by firing a paste that contains any of these metals, for example, but the present disclosure is not limited to this configuration. The thickness of the conductive portion 5 is not specifically limited, and is about 5 μm to about 30 μm, for example.

The shape (pattern) of the conductive portion 5 is not specifically limited, and the conductive portion 5 includes, for example, at least one wiring portion (a first wiring portion, a second wiring portion, etc.), at least one base portion, and at least one connection portion. In the example shown in FIG. 11, the conductive portion 5 includes a plurality of wiring portions 50A to 50P, a plurality of wiring portions 50U to 50W, a first base portion 55, a second base portion 56, and a connection portion 57. In the illustrated example, the wiring portions 50U to 50W are one example of "first wiring portions", and the wiring portions 50A to 50C are one example of "second wiring portions".

The shape of the first base portion 55 is not specifically limited, and is a rectangular shape, a polygonal shape, a circular shape, or an elliptical shape, for example. In the illustrated example, the first base portion 55 has a rectangular shape that is elongated in the x direction.

The shape of the second base portion 56 is not specifically limited, and is a rectangular shape, a polygonal shape, a circular shape, or an elliptical shape, for example. In the illustrated example, the second base portion 56 has a rectangular shape that is elongated in the x direction.

The connection portion 57 is interposed between the first base portion 55 and the second base portion 56, and connects the first base portion 55 and the second base portion 56 to each other in the illustrated example. The shape of the connection portion 57 is not specifically limited, and may be any of a linear shape and a non-linear shape (which is bent or curved as a whole, for example).

In the example shown in FIG. 11, each of the first base portion 55, the second base portion 56, and the connection portion 57 has a first side and a second side that are spaced apart from each other in the y direction (the second side is closer to the sixth surface 36 than the first side is). The second sides (three sides) of the first base portion 55, the second base portion 56, and the connection portion 57 are aligned with each other in the x direction and constitute a single straight line segment (the three sides are located at the same position in the y direction).

As shown in FIG. 11, the wiring portion 50A is constituted by a first portion 51A, a second portion 52A, and a third portion 53A, for example.

The shape of the first portion 51A is not specifically limited, and is a rectangular shape, a polygonal shape, a circular shape, or an elliptical shape, for example. In the illustrated example, the first portion 51A has a rectangular shape that is elongated in the x direction. The first portion 51A is arranged on the third surface 33 side in the x direction with respect to the first base portion 55 and is spaced apart from the first base portion 55. The first portion 51A overlaps a portion of the first base portion 55 as viewed in the x direction.

The second portion 52A is arranged on the fifth surface 35 side in the y direction with respect to the first portion 51A. The shape of the second portion 52A is not specifically limited, and is a rectangular shape, a polygonal shape, a circular shape, or an elliptical shape, for example. In the illustrated example, the second portion 52A has a rectangular shape and is elongated in the y direction.

The third portion 53A is interposed between the first portion 51A and the second portion 52A, and is continuous to the first portion 51A and the second portion 52A in the illustrated example. The shape of the third portion 53A is not specifically limited, and is a rectangular shape (band shape) that is elongated in the y direction in the illustrated example.

As shown in FIG. 11, the wiring portion 50B is constituted by a first portion 51B and a second portion 52B.

The shape of the first portion 51B is not specifically limited, and is a rectangular shape, a polygonal shape, a circular shape, or an elliptical shape, for example. In the illustrated example, the first portion 51B has a rectangular shape that is elongated in the y direction. The first portion 51B is arranged on the fifth surface 35 side in the y direction with respect to the first base portion 55 and is spaced apart from the first base portion 55. The first portion 51B is arranged on the fourth surface 34 side in the x direction with respect to the first portion 51A and is spaced apart from the first portion 51A.

The second portion 52B is arranged on the fifth surface 35 side in the y direction with respect to the first portion 51B. The second portion 52B is arranged on the fourth surface 34 side in the x direction with respect to the second portion 52A and is spaced apart from the second portion 52A. The shape of the second portion 52B is not specifically limited, and is a rectangular shape, a polygonal shape, a circular shape, or an elliptical shape, for example. In the illustrated example, the second portion 52B has a rectangular shape that is elongated in the x direction. The first portion 51B and the second portion 52B are continuous to each other.

As shown in FIG. 11, the wiring portion 50C is constituted by a first portion 51C and a second portion 52C.

The shape of the first portion 51C is not specifically limited, and is a rectangular shape, a polygonal shape, a circular shape, or an elliptical shape, for example. In the illustrated example, the first portion 51C has a rectangular shape that is elongated in the y direction. The first portion 51C is arranged on the fifth surface 35 side in the y direction with respect to the first base portion 55 and is spaced apart from the first base portion 55. The first portion 51C is arranged on the fourth surface 34 side in the x direction with respect to the first portion 51B and is spaced apart from the first portion 51B. The first portion 51C overlaps the first portion 51B as viewed in the x direction.

The second portion 52C is arranged on the fifth surface 35 side in the y direction with respect to the first portion 51C. The second portion 52C is arranged on the fourth surface 34 side in the x direction with respect to the second portion 52B and is spaced apart from the second portion 52B. The shape of the second portion 52C is not specifically limited, and is a rectangular shape, a polygonal shape, a circular shape, or an elliptical shape, for example. The first portion 51C and the second portion 52C are continuous to each other.

The wiring portion 50U is spaced apart from the wiring portion 50A and is adjacent to a portion of the wiring portion 50A. The shape of the wiring portion 50U is not specifically limited, and is a rectangular shape, a polygonal shape, a circular shape, or an elliptical shape, for example. In the illustrated example, the wiring portion 50U has a rectangular shape. The wiring portion 50U is arranged on the fifth surface 35 side in the y direction with respect to the first portion 51A of the wiring portion 50A.

The wiring portion 50V is spaced apart from the wiring portion 50B and is adjacent to a portion of the wiring portion 50B. The shape of the wiring portion 50V is not specifically limited, and is a rectangular shape, a polygonal shape, a circular shape, or an elliptical shape, for example. In the illustrated example, the wiring portion 50V has a rectangular shape. The wiring portion 50V is arranged on the third surface 33 side in the x direction with respect to the first portion 51B of the wiring portion 50B. The wiring portion 50V is arranged on the fourth surface 34 side in the x direction with respect to the wiring portion 50U and is spaced apart from the wiring portion 50U.

The wiring portion 50W is spaced apart from the wiring portion 50C and is adjacent to a portion of the wiring portion 50C. The shape of the wiring portion 50W is not specifically limited, and is a rectangular shape, a polygonal shape, a circular shape, or an elliptical shape, for example. In the illustrated example, the wiring portion 50W has a rectangular shape. The wiring portion 50W is arranged on the fourth surface 34 side in the x direction with respect to the first portion 51C of the wiring portion 50C. The wiring portion 50W is arranged on the fourth surface 34 side in the x direction with respect to the wiring portion 50V and is spaced apart from the wiring portion 50V with the first portion 51B and the first portion 51C interposed between the wiring portion 50W and the wiring portion 50V.

The wiring portions 50D to 50G are arranged on the fourth surface 34 side in the x direction with respect to the wiring portion 50W. In FIG. 11, the wiring portions 50D to 50G are arranged in this order. Each of the wiring portions 50D to 50G includes two rectangular pad-shaped portions and a band-shaped portion that has a bent shape and connects the pad-shaped portions to each other.

The wiring portion 50H is continuous to the second base portion 56 and extends from the second base portion 56 toward the fifth surface 35 in the y direction. The wiring portion 50H includes a pad-shaped portion.

The wiring portions 50I to 50N are arranged on the fourth surface 34 side in the x direction with respect to the wiring portion 50H and are arranged in this order. Each of the wiring portions 50I to 50N includes a pad-shaped portion that is located on the second base portion 56 side, a pad-shaped portion that is located on the fifth surface 35 side, and a band-shaped portion that connects these pad-shaped portions to each other.

The wiring portion 50O is continuous to the second base portion 56 and extends from the second base portion 56 in a direction that is inclined with respect to the x direction. The wiring portion 50O includes a pad-shaped portion that is located on the fourth surface 34 side and a band-shaped portion that connects the pad-shaped portion to the second base portion 56.

The wiring portion 50P is located on the sixth surface 36 side in the y direction with respect to the wiring portion 50O and on the fourth surface 34 side in the x direction with respect to the second base portion 56. The wiring portion 50P includes a pad-shaped portion that is located on the fourth surface 34 side, a pad-shaped portion that is located on the second base portion 56 side, and a band-shaped portion that connects these pad-shaped portions to each other.

The substrate 3 shown in FIG. 11 includes two regions, i.e., a first region 30A and a second region 30B, that are adjacent to each other in the y direction, for example. The first region 30A is close to the sixth surface 36 and the second region 30B is close to the fifth surface 35. The above-described wiring portions 50A to 50P and 50U to 50W are provided in the second region 30B.

<Joining Portions 6>

As shown in FIGS. 11 to 13, the plurality of joining portions 6 are formed on the substrate 3. In the illustrated example, the plurality of joining portions 6 are formed on the first surface 31 of the substrate 3. The material of the joining portions 6 is not specifically limited, and the joining portions 6 are constituted by a material that can join the substrate 3 and the leads 1, for example. The joining portions 6 are made of an electrically conductive material, for example. The electrically conductive material constituting the joining portions 6 is not specifically limited. Examples of the electrically conductive material of the joining portions 6 include materials that contain silver (Ag), copper (Cu), gold (Au), etc. The following describes a case in which the joining portions 6 contain silver. The joining portions 6 in this example contain the same electrically conductive material as that constituting the conductive portion 5. Note that the joining portions 6 may also contain copper instead of silver, or contain gold instead of silver or copper. Alternatively, the joint portions 6 may also contain Ag—Pt or Ag—Pd. The method for forming the joining portions 6 is not limited, and the joining portions 6 are formed by, for example, firing a paste that contains any of these metals, similarly to the conductive portion 5. The thickness of the joining portions 6 is not specifically limited, and is about 5 µm to about 30 µm, for example.

In the illustrated example, the plurality of joining portions 6 include joining portions 6A to 6D.

The joining portion 6A is arranged on the sixth surface 36 side in the y direction with respect to the conductive portion 5. The joining portion 6A overlaps the entire first base portion 55 as viewed in the y direction. The shape of the joining portion 6A is not specifically limited.

The joining portion 6B is arranged on the sixth surface 36 side in the y direction with respect to the conductive portion 5. The joining portion 6B is arranged on the fourth surface 34 side in the x direction with respect to the joining portion 6A. In the illustrated example, the joining portion 6B overlaps the connection portion 57 and the second base portion 56 as viewed in the y direction. The shape of the joining portion 6B is not specifically limited.

The joining portion 6C is arranged on the sixth surface 36 side in the y direction with respect to the conductive portion 5. The joining portion 6C is arranged on the fourth surface 34 side in the x direction with respect to the joining portion 6B. In the illustrated example, the entire joining portion 6C overlaps the second base portion 56 as viewed in the y direction. The shape of the joining portion 6C is not specifically limited.

The joining portion 6D is arranged on the sixth surface 36 side in the y direction with respect to the conductive portion 5. The joining portion 6D is arranged on the fourth surface 34 side in the x direction with respect to the joining portion 6C. In the illustrated example, the joining portion 6D overlaps the second base portion 56, the wiring portion 50O, and the wiring portion 50P as viewed in the y direction. The shape of the joining portion 6D is not specifically limited.

The joining portions 6A to 6D are formed in a region of the substrate 3 that is located on the sixth surface 36 side in the y direction with respect to the conductive portion 5. In plan view, the region on the sixth surface 36 side of the substrate 3 in which the joining portions 6 are formed is defined as the first region 30A.

<Leads 1>

The plurality of leads 1 contain a metal and are superior to the substrate 3 in heat dissipation properties, for example. The metal constituting the leads 1 is not specifically limited, and is copper (Cu), aluminum, iron (Fe), oxygen free copper, or an alloy of any of these metals (e.g., a Cu—Sn alloy, a Cu—Zr alloy, a Cu—Fe alloy, etc.), for example. The plurality of leads 1 may also be plated with nickel (Ni). The plurality of leads 1 may be formed by pressing a die against a metal plate or etching a metal plate with a pattern, for example, but there is no limitation to this configuration. The thickness of the leads 1 is not specifically limited, and is about 0.4 mm to about 0.8 mm, for example.

In the example shown in FIGS. 6 to 9, the plurality of leads 1 include a plurality of leads 1A to 1G and 1Z. The plurality of leads 1A to 1G constitute conduction paths to the transistors 4A to 4F, for example.

Each of the leads 1A to 1D (first leads) is arranged on the substrate 3, and is arranged on the first surface 31 in the illustrated example. The lead 1A is joined to the joining portion 6A via a joining material 81. The joining material 81 is only required to be capable of joining the lead 1A to the joining portion 6A. From the standpoint of efficiently conducting heat from the lead 1A to the substrate 3, a joining material 81 having higher thermal conductivity is preferable, and a silver paste, a copper paste, solder, etc., is used as the joining material 81, for example. However, the joining material 81 may also be a material that has insulating properties, such as an epoxy-based resin, a silicone-based resin, etc. If the joining portion 6A is not formed on the substrate 3, the lead 1A may also be joined to the substrate 3.

The configuration of the lead 1A is not specifically limited, and the lead 1A is constituted by a first portion 11A, a second portion 12A, a third portion 13A, and a fourth portion 14A in the illustrated example.

As shown in FIGS. 12 and 13, the first portion 11A includes a main surface 111A, a back surface 112A, and a plurality of recessed portions 1111A.

The main surface 111A faces the same side as the first surface 31 in the z direction.

The back surface 112A faces the side opposite to the main surface 111A in the z direction, and is a flat surface in the illustrated example. As shown in FIG. 12 and the 13, the back surface 112A is joined to the joining portion 6A via the joining material 81.

The plurality of recessed portions 1111A are recessed from the main surface 111A in the z direction. The shape of the recessed portions 1111A viewed from the z direction is not specifically limited, and may be a circular shape, an elliptical shape, a rectangular shape, or a triangular shape, for example. In the illustrated example, the plurality of recessed portions 1111A are arranged in a matrix pattern.

The third portion 13A and the fourth portion 14A are covered by the package 7. The third portion 13A is continuous to the first portion 11A and the fourth portion 14A. In the illustrated example, the third portion 13A is continuous to a portion of the first portion 11A that is located between a fourth surface 124Aa and an eighth surface 124Ab. The third portion 13A overlaps the sixth surface 36 as viewed in the z direction. As shown in FIG. 12, the fourth portion 14A is located at a position that is shifted with respect to the first portion 11A toward the side that the main surface 111A faces, in the z direction. An end portion of the fourth portion 14A is flush with a sixth surface 76 of the package 7.

The second portion 12A is continuous to the end portion of the fourth portion 14A and is a portion of the lead 1A that protrudes from the package 7. The second portion 12A protrudes toward the side opposite to the first portion 11A in the y direction. The second portion 12A is used to electrically connect the switch driving device A1 to an external circuit, for example. In the illustrated example, the second portion 12A is bent in the z direction toward the side that the main surface 111A faces.

The lead 1B is joined to the joining portion 6B via the above-described joining material 81. If the joining portion 6B is not formed on the substrate 3, the lead 1B may also be joined to the substrate 3.

The configuration of the lead 1B is not specifically limited, and the lead 1B is constituted by a first portion 11B, a second portion 12B, a third portion 13B, and a fourth portion 14B in the illustrated example.

As illustrated, the first portion 11B includes a main surface 111B, a back surface 112B, and a plurality of recessed portions 1111B.

The main surface 111B faces the same side as the first surface 31 in the z direction.

The back surface 112B faces the side opposite to the main surface 111B in the z direction, and is a flat surface in the illustrated example. As shown in FIG. 13, the back surface 112B is joined to the joining portion 6B via the joining material 81.

The plurality of recessed portions 1111B are recessed from the main surface 111B in the z direction. The shape of the recessed portions 1111B viewed from the z direction is not specifically limited, and may be a circular shape, an elliptical shape, a rectangular shape, or a triangular shape, for example. In the illustrated example, the plurality of recessed portions 1111B are arranged in a matrix pattern.

The third portion 13B and the fourth portion 14B are covered by the package 7. The third portion 13B is continuous to the first portion 11B and the fourth portion 14B. In the illustrated example, the third portion 13B is continuous to a portion of the first portion 11B that is adjacent to a fourth surface 124B. The third portion 13B overlaps the sixth surface 36 as viewed in the z direction. Similarly to the fourth portion 14A of the lead 1A, the fourth portion 14B is located at a position that is shifted with respect to the first portion 11B toward the side that the main surface 111B faces, in the z direction. An end portion of the fourth portion 14B is flush with the sixth surface 76 of the package 7.

The second portion 12B is continuous to the end portion of the fourth portion 14B and is a portion of the lead 1B that protrudes from the package 7. The second portion 12B protrudes toward the side opposite to the first portion 11B in the y direction. The second portion 12B is used to electrically connect the switch driving device A1 to an external circuit, for example. In the illustrated example, the second portion 12B is bent in the z direction toward the side that the main surface 111B faces.

The lead 1C is joined to the joining portion 6C via the above-described joining material 81. If the joining portion 6C is not formed on the substrate 3, the lead 1C may also be joined to the substrate 3.

The configuration of the lead 1C is not specifically limited, and the lead 1C is constituted by a first portion 11C, a second portion 12C, a third portion 13C, and a fourth portion 14C in the example shown in FIG. 9.

As shown in FIG. 13, the first portion 11C includes a main surface 111C, a back surface 112C, and a plurality of recessed portions 1111C.

The main surface 111C faces the same side as the first surface 31 in the z direction.

The back surface 112C faces the side opposite to the main surface 111C in the z direction, and is a flat surface in the illustrated example. As shown in FIG. 13, the back surface 112C is joined to the joining portion 6C via the joining material 81.

The plurality of recessed portions 1111C are recessed from the main surface 111C in the z direction. The shape of the recessed portions 1111C viewed from the z direction is not specifically limited, and may be a circular shape, an elliptical shape, a rectangular shape, or a triangular shape, for example. In the illustrated example, the plurality of recessed portions 1111C are arranged in a matrix pattern.

The third portion 13C and the fourth portion 14C are covered by the package 7. The third portion 13C is continuous to the first portion 11C and the fourth portion 14C. In the illustrated example, the third portion 13C is continuous to a portion of the first portion 11C that is adjacent to a fourth surface 124C. The third portion 13C overlaps the sixth surface 36 as viewed in the z direction. Similarly to the fourth portion 14A of the lead 1A, the fourth portion 14C is located at a position that is shifted with respect to the first portion 11C toward the side that the main surface 111C faces, in the z direction, and is continuous to the second portion 12C. An end portion of the fourth portion 14C is flush with the sixth surface 76 of the package 7.

The second portion 12C is continuous to the end portion of the fourth portion 14C and is a portion of the lead 1C that protrudes from the package 7. The second portion 12C protrudes toward the side opposite to the first portion 11C in the y direction. The second portion 12C is used to electrically connect the switch driving device A1 to an external circuit, for example. In the illustrated example, the second portion 12C is bent in the z direction toward the side that the main surface 111C faces.

The lead 1D is joined to the joining portion 6D via the above-described joining material 81. If the joining portion 6D is not formed on the substrate 3, the lead 1D may also be joined to the substrate 3.

The configuration of the lead 1D is not specifically limited, and the lead 1D is constituted by a first portion 11D, a second portion 12D, a third portion 13D, and a fourth portion 14D in the example shown in FIG. 9.

As shown in FIG. 13, the first portion 11D includes a main surface 111D, a back surface 112D, and a plurality of recessed portions 1111D.

The main surface 111D faces the same side as the first surface 31 in the z direction.

The back surface 112D faces the side opposite to the main surface 111D in the z direction, and is a flat surface in the illustrated example. As shown in FIG. 13, the back surface 112D is joined to the joining portion 6D via the joining material 81.

The plurality of recessed portions 1111D are recessed from the main surface 111D in the z direction. The shape of the recessed portions 1111D viewed from the z direction is not specifically limited, and may be a circular shape, an elliptical shape, a rectangular shape, or a triangular shape, for example. In the illustrated example, the plurality of recessed portions 1111D are arranged in a matrix pattern.

The third portion 13D is continuous to the first portion 11D and the fourth portion 14D. In the illustrated example, the third portion 13D is continuous to a portion of the first portion 11D that is adjacent to a fourth surface 124D. The third portion 13D overlaps the sixth surface 36 as viewed in the z direction, and is covered by the package 7. Similarly to the fourth portion 14A of the lead 1A, the fourth portion 14D is located at a position that is shifted with respect to the first portion 11D toward the side that the main surface 111D faces, in the z direction, and is continuous to the second portion 12D. An end portion of the fourth portion 14D is flush with the sixth surface 76 of the package 7.

The second portion 12D is continuous to the end portion of the fourth portion 14D and is a portion of the lead 1D that protrudes from the package 7. The second portion 12D protrudes toward the side opposite to the first portion 11D in the y direction. The second portion 12D is used to electrically connect the switch driving device A1 to an external circuit, for example. In the illustrated example, the second portion 12D is bent in the z direction toward the side that the main surface 111D faces.

The lead 1E is spaced apart from the substrate 3 as viewed in the z direction. In the illustrated example, the lead 1E is arranged on the side that the sixth surface 36 faces in the y direction with respect to the substrate 3.

The configuration of the lead 1E is not specifically limited, and the lead 1E is constituted by a second portion 12E and a fourth portion 14E in the example shown in FIG. 9.

The fourth portion 14E is covered by the package 7. Similarly to the fourth portion 14D of the lead 1D, the fourth portion 14E is located at a position that is shifted with respect to the first portion 11D toward the side that the main surface 111D faces, in the z direction. The fourth portion 14E overlaps the first portion 11D as viewed in the y direction. An end portion of the fourth portion 14E is flush with the sixth surface 76 of the package 7.

The second portion 12E is continuous to the end portion of the fourth portion 14E and is a portion of the lead 1E that protrudes from the package 7. The second portion 12E protrudes toward the side opposite to the fourth portion 14E in the y direction. The second portion 12E is used to electrically connect the switch driving device A1 to an external circuit, for example. In the illustrated example, the second portion 12E is bent in the z direction toward the side that the first surface 31 faces.

The lead 1F is spaced apart from the substrate 3 as viewed in the z direction. In the illustrated example, the lead 1F is arranged on the side that the sixth surface 36 faces in the y direction with respect to the substrate 3. The lead 1F is arranged on the side opposite to the fourth portion 14D with respect to the lead 1E in the x direction.

The configuration of the lead 1F is not specifically limited, and the lead 1F is constituted by a second portion 12F and a fourth portion 14F in the example shown in FIG. 9.

The fourth portion 14F is covered by the package 7. Similarly to the fourth portion 14D of the lead 1D, the fourth portion 14F is located at a position that is shifted with respect to the first portion 11D toward the side that the main surface 111D faces, in the z direction. The fourth portion 14F overlaps the first portion 11D as viewed in the y direction. An end portion of the fourth portion 14F is flush with the sixth surface 76 of the package 7.

The second portion 12F is continuous to the end portion of the fourth portion 14F and is a portion of the lead 1F that protrudes from the package 7. The second portion 12F protrudes toward the side opposite to the fourth portion 14F in the y direction. The second portion 12F is used to electrically connect the switch driving device A1 to an external circuit, for example. In the illustrated example, the second portion 12F is bent in the z direction toward the side that the first surface 31 faces.

The lead 1G is spaced apart from the substrate 3 as viewed in the z direction. In the illustrated example, the lead 1G is arranged on the side that the fourth surface 34 faces in the x direction with respect to the substrate 3. The lead 1G is arranged on the side opposite to the fourth portion 14D with respect to the lead 1E in the x direction.

The configuration of the lead 1G is not specifically limited, and the lead 1G is constituted by a second portion 12G and a fourth portion 14G in the example shown in FIG. 9.

The fourth portion 14G is covered by the package 7. Similarly to the fourth portion 14D of the lead 1D, the fourth portion 14G is located at a position that is shifted with respect to the first portion 11D toward the side that the main surface 111D faces, in the z direction. The fourth portion 14G overlaps the fourth portion 14F as viewed in the y direction. An end portion of the fourth portion 14G is flush with the sixth surface 76 of the package 7.

The second portion 12G is continuous to the end portion of the fourth portion 14G and is a portion of the lead 1G that protrudes from the package 7. The second portion 12G protrudes toward the side opposite to the fourth portion 14G in the y direction. The second portion 12G is used to electrically connect the switch driving device A1 to an external circuit, for example. In the illustrated example, the second portion 12G is bent in the z direction toward the side that the first surface 31 faces.

The lead 1Z is spaced apart from the substrate 3 as viewed in the z direction. In the illustrated example, the lead 1Z is arranged on the side that the third surface 33 faces in the x direction with respect to the substrate 3. The lead 1Z is arranged on the side opposite to the lead 1B with respect to the lead 1A in the x direction.

The configuration of the lead 1Z is not specifically limited, and the lead 1Z is constituted by a second portion 12Z and a fourth portion 14Z in the example shown in FIG. 9. The lead 1Z is insulated from circuits of the switch driving device A1.

The fourth portion 14Z is covered by the package 7. Similarly to the fourth portion 14D of the lead 1D, the fourth portion 14Z is located at a position that is shifted with respect to the first portion 11D toward the side that the main surface 111D faces, in the z direction. The shape of the fourth portion 14Z is not specifically limited, and is a band shape that extends in the y direction in the illustrated example. An end portion of the fourth portion 14Z is flush with the sixth surface 76 of the package 7.

The second portion 12Z is continuous to the end portion of the fourth portion 14Z and is a portion of the lead 1Z that protrudes from the package 7. The second portion 12Z protrudes toward the side opposite to the fourth portion 14Z in the y direction. The second portion 12Z is used to mount the switch driving device A1 to an external circuit board, for example. In the illustrated example, the second portion 12Z is bent in the z direction toward the side that the first surface 31 faces.

As shown in FIG. 9, the second portions 12A, 12B, 12C, and 12D are arranged with a distance G11 therebetween in the x direction. These second portions are spaced apart from each other by substantially the same distance G11. The second portions 12D and 12E are arranged with a distance G12 therebetween in the x direction. The distance G12 is substantially the same as the distance G11. The second portions 12E, 12F, and 12G are arranged with a distance G13 therebetween in the x direction. The distance G13 is shorter than the distance G11. The second portions 12A and 12Z are arranged with a distance G14 therebetween in the x direction. The distance G14 is longer than the distance G11.

<Leads 2>

The plurality of leads 2 contain a metal and are superior to the substrate 3 in heat dissipation properties, for example. The metal constituting the leads 2 is not specifically limited, and is copper (Cu), aluminum, iron (Fe), oxygen free copper, or an alloy of any of these metals (e.g., a Cu—Sn alloy, a Cu—Zr alloy, a Cu—Fe alloy, etc.), for example. The plurality of leads 2 may also be plated with nickel (Ni). The plurality of leads 2 may be formed by pressing a die against a metal plate or etching a metal plate with a pattern, for example, but there is no limitation to this configuration. The thickness of the leads 2 is not specifically limited, and is about 0.4 mm to about 0.8 mm, for example. The plurality of leads 2 overlap the second region 30B of the substrate 3 as viewed in the z direction.

In the example shown in FIGS. 6 to 9, the plurality of leads 2 include a plurality of leads 2A to 2P and 2Z. The plurality of leads 2A to 2O constitute conduction paths to the upper driver chip 4G and the lower driver chip 4H, for example.

Specific configurations of the leads 2A to 2P and 2Z are not specifically limited. The configuration of the lead 2C described below with reference to FIG. 12 can be appropriately adopted for the leads 2A to 2P.

The lead 2C is spaced apart from the plurality of leads 1. The lead 2C is arranged on the conductive portion 5. The lead 2C is electrically connected to the conductive portion 5. The lead 2C is one example of a "second lead". The lead 2C is joined to the second portion 52C of the wiring portion 50C of the conductive portion 5 via conductive joining material 82.

The configuration of the lead 2C is not specifically limited, and the lead 2C is constituted by a first portion 21C, a second portion 22C, a third portion 23C, and a fourth portion 24C in the example shown in FIGS. 9 and 12. This specific configuration can be appropriately adopted for the leads 2A, 2B, and 2D to 2P.

The first portion 21C is joined to the wiring portion 50C. The shape of the first portion 21C is not specifically limited, and is a rectangular shape, a polygonal shape, a circular shape, or an elliptical shape, for example. In the illustrated example, the first portion 21C has an elongated rectangular shape with a longitudinal direction extending in the y direction. In the illustrated example, the first portion 21C overlaps the wiring portion 50C as viewed in the z direction. The first portion 21C includes a through hole 211C. The through hole 211C extends through the first portion 21C in the z direction. As shown in FIG. 12, the inside of the through hole 211C is filled with the conductive joining material 82. The conductive joining material 82 extends to a surface of the lead 2C. However, a configuration is also possible in which the conductive joining material 82 does not extend from the through hole 211C and reach the surface of the lead 2C.

The third portion 23C and the fourth portion 24C are covered by the package 7. The third portion 23C is continuous to the first portion 21C and the fourth portion 24C. As shown in FIG. 12, the fourth portion 24C is located at a position that is shifted with respect to the first portion 21C toward the side that the first surface 31 faces, in the z direction. An end portion of the fourth portion 24C is flush with the sixth surface 75 of the package 7. In the illustrated example, the first portion 21C, the third portion 23C, and the fourth portion 24C substantially match as viewed in the y direction.

The second portion 22C is continuous to the end portion of the fourth portion 24C and is a portion of the lead 2C that protrudes from the package 7 toward the side opposite to the plurality of leads 1 as viewed in the y direction. The second portion 22C protrudes toward the side opposite to the first portion 21C in the y direction. The second portion 22C is used to electrically connect the switch driving device A1 to an external circuit, for example. In the illustrated example, the second portion 22C is bent in the z direction toward the side that the first surface 31 faces.

The lead 2A is spaced apart from the plurality of leads 1. The lead 2A is arranged on the conductive portion 5. The lead 2A is electrically connected to the conductive portion 5. The lead 2A is one example of the "second lead". The lead 2A is joined to the wiring portion 50A of the conductive portion 5 via the conductive joining material (first conductive joining material) 82. The conductive joining material 82 is only required to be capable of joining and electrically connecting the lead 2A to the wiring portion 50A. A silver paste, a copper paste, solder, etc., is used as the conductive joining material 82, for example.

The configuration of the lead 2A is not specifically limited, and is similar to the configuration of the lead 2C and includes a second portion 22A in the illustrated example.

The second portion 22A is a portion of the lead 2A that protrudes from the package 7 toward the side opposite to the plurality of leads 1 as viewed in the y direction. The second portion 22A is used to electrically connect the switch driving device A1 to an external circuit, for example. In the illustrated example, the second portion 22A is bent in the z direction toward the side that the first surface 31 faces.

The lead 2B is spaced apart from the plurality of leads 1. The lead 2B is arranged on the conductive portion 5. The lead 2B is electrically connected to the conductive portion 5. The lead 2B is one example of the "second lead". The lead 2B is joined to the wiring portion 50B of the conductive portion 5 via the above-described conductive joining material 82.

The configuration of the lead 2B is not specifically limited, and is similar to the configuration of the lead 2C and includes a second portion 22B in the illustrated example.

The second portion 22B is a portion of the lead 2B that protrudes from the package 7 toward the side opposite to the plurality of leads 1 as viewed in the y direction. The second portion 22B is used to electrically connect the switch driving device A1 to an external circuit, for example. In the illustrated example, the second portion 22B is bent in the z direction toward the side that the first surface 31 faces.

The lead 2D is spaced apart from the plurality of leads 1. The lead 2D is arranged on the conductive portion 5. The lead 2D is electrically connected to the conductive portion 5. The lead 2D is one example of the "second lead". The lead 2D is joined to the wiring portion 50D of the conductive portion 5 via the above-described conductive joining material 82.

The configuration of the lead 2D is not specifically limited, and is similar to the configuration of the lead 2C and includes a second portion 22D in the illustrated example.

The second portion 22D is a portion of the lead 2D that protrudes from the package 7 toward the side opposite to the plurality of leads 1 as viewed in the y direction. The second portion 22D is used to electrically connect the switch driving device A1 to an external circuit, for example. In the illustrated example, the second portion 22D is bent in the z direction toward the side that the first surface 31 faces.

The lead 2E is spaced apart from the plurality of leads 1. The lead 2E is arranged on the conductive portion 5. The lead 2E is electrically connected to the conductive portion 5. The lead 2E is one example of the "second lead". The lead 2E is joined to the wiring portion 50E of the conductive portion 5 via the above-described conductive joining material 82.

The configuration of the lead 2E is not specifically limited, and is similar to the configuration of the lead 2C and includes a second portion 22E in the illustrated example.

The second portion 22E is a portion of the lead 2E that protrudes from the package 7 toward the side opposite to the plurality of leads 1 as viewed in the y direction. The second portion 22E is used to electrically connect the switch driving device A1 to an external circuit, for example. In the illustrated example, the second portion 22E is bent in the z direction toward the side that the first surface 31 faces.

The lead 2F is spaced apart from the plurality of leads 1. The lead 2F is arranged on the conductive portion 5. The lead 2F is electrically connected to the conductive portion 5. The lead 2F is one example of the "second lead". The lead 2F is joined to the wiring portion 50F of the conductive portion 5 via the above-described conductive joining material 82.

The configuration of the lead 2F is not specifically limited, and is similar to the configuration of the lead 2C and includes a second portion 22F in the illustrated example.

The second portion 22F is a portion of the lead 2F that protrudes from the package 7 toward the side opposite to the plurality of leads 1 as viewed in the y direction. The second portion 22F is used to electrically connect the switch driving device A1 to an external circuit, for example. In the illustrated example, the second portion 22F is bent in the z direction toward the side that the first surface 31 faces.

The lead 2G is spaced apart from the plurality of leads 1. The lead 2G is arranged on the conductive portion 5. The lead 2G is electrically connected to the conductive portion 5. The lead 2G is one example of the "second lead". The lead 2G is joined to the wiring portion 50G of the conductive portion 5 via the above-described conductive joining material 82.

The configuration of the lead 2G is not specifically limited, and is similar to the configuration of the lead 2C and includes a second portion 22G in the illustrated example.

The second portion 22G is a portion of the lead 2G that protrudes from the package 7 toward the side opposite to the plurality of leads 1 as viewed in the y direction. The second portion 22G is used to electrically connect the switch driving device A1 to an external circuit, for example. In the illustrated example, the second portion 22G is bent in the z direction toward the side that the first surface 31 faces.

The lead 2H is spaced apart from the plurality of leads 1. The lead 2H is arranged on the conductive portion 5. The lead 2H is electrically connected to the conductive portion 5. The lead 2H is one example of the "second lead". The lead 2H is joined to the wiring portion 50H of the conductive portion 5 via the above-described conductive joining material 82.

The configuration of the lead 2H is not specifically limited, and is similar to the configuration of the lead 2C and includes a second portion 22H in the illustrated example.

The second portion 22H is a portion of the lead 2H that protrudes from the package 7 toward the side opposite to the plurality of leads 1 as viewed in the y direction. The second portion 22H is used to electrically connect the switch driving device A1 to an external circuit, for example. In the illustrated example, the second portion 22H is bent in the z direction toward the side that the first surface 31 faces.

The lead 2I is spaced apart from the plurality of leads 1. The lead 2I is arranged on the conductive portion 5. The lead 2I is electrically connected to the conductive portion 5. The lead 2I is one example of the "second lead". The lead 2I is joined to the wiring portion 50I of the conductive portion 5 via the above-described conductive joining material 82.

The configuration of the lead 2I is not specifically limited, and is similar to the configuration of the lead 2C and includes a second portion 22I in the illustrated example.

The second portion 22I is a portion of the lead 2I that protrudes from the package 7 toward the side opposite to the plurality of leads 1 as viewed in the y direction. The second portion 22I is used to electrically connect the switch driving device A1 to an external circuit, for example. In the illustrated example, the second portion 22I is bent in the z direction toward the side that the first surface 3I faces.

The lead 2J is spaced apart from the plurality of leads 1. The lead 2J is arranged on the conductive portion 5. The lead 2J is electrically connected to the conductive portion 5. The lead 2J is one example of the "second lead". The lead 2J is joined to the wiring portion 50J of the conductive portion 5 via the above-described conductive joining material 82.

The configuration of the lead 2J is not specifically limited, and is similar to the configuration of the lead 2C and includes a second portion 22J in the illustrated example.

The second portion 22J is a portion of the lead 2J that protrudes from the package 7 toward the side opposite to the plurality of leads 1 as viewed in the y direction. The second portion 22J is used to electrically connect the switch driving device A1 to an external circuit, for example. In the illustrated example, the second portion 22J is bent in the z direction toward the side that the first surface 31 faces.

The lead 2K is spaced apart from the plurality of leads 1. The lead 2K is arranged on the conductive portion 5. The lead 2K is electrically connected to the conductive portion 5. The lead 2K is one example of the "second lead". The lead 2K is joined to the wiring portion 50K of the conductive portion 5 via the above-described conductive joining material 82.

The configuration of the lead 2K is not specifically limited, and is similar to the configuration of the lead 2C and includes a second portion 22K in the illustrated example.

The second portion 22K is a portion of the lead 2K that protrudes from the package 7 toward the side opposite to the plurality of leads 1 as viewed in the y direction. The second portion 22K is used to electrically connect the switch driving device A1 to an external circuit, for example. In the illustrated example, the second portion 22K is bent in the z direction toward the side that the first surface 31 faces.

The lead 2L is spaced apart from the plurality of leads 1. The lead 2L is arranged on the conductive portion 5. The lead 2L is electrically connected to the conductive portion 5. The lead 2L is one example of the "second lead". The lead 2L is joined to the wiring portion 50L of the conductive portion 5 via the above-described conductive joining material 82.

The configuration of the lead 2L is not specifically limited, and is similar to the configuration of the lead 2C and includes a second portion 22L in the illustrated example.

The second portion 22L is a portion of the lead 2L that protrudes from the package 7 toward the side opposite to the plurality of leads 1 as viewed in the y direction. The second portion 22L is used to electrically connect the switch driving device A1 to an external circuit, for example. In the illustrated example, the second portion 22L is bent in the z direction toward the side that the first surface 31 faces.

The lead 2M is spaced apart from the plurality of leads 1. The lead 2M is arranged on the conductive portion 5. The lead 2M is electrically connected to the conductive portion 5. The lead 2M is one example of the "second lead". The lead 2M is joined to the wiring portion 50M of the conductive portion 5 via the above-described conductive joining material 82.

The configuration of the lead 2M is not specifically limited, and is similar to the configuration of the lead 2C and includes a second portion 22M in the illustrated example.

The second portion 22M is a portion of the lead 2M that protrudes from the package 7 toward the side opposite to the plurality of leads 1 as viewed in the y direction. The second portion 22M is used to electrically connect the switch driving device A1 to an external circuit, for example. In the illustrated example, the second portion 22M is bent in the z direction toward the side that the first surface 31 faces.

The lead 2N is spaced apart from the plurality of leads 1. The lead 2N is arranged on the conductive portion 5. The lead 2N is electrically connected to the conductive portion 5. The lead 2N is one example of the "second lead". The lead 2N is joined to the wiring portion 50N of the conductive portion 5 via the above-described conductive joining material 82.

The configuration of the lead 2N is not specifically limited, and is similar to the configuration of the lead 2C and includes a second portion 22N in the illustrated example.

The second portion 22N is a portion of the lead 2N that protrudes from the package 7 toward the side opposite to the plurality of leads 1 as viewed in the y direction. The second portion 22N is used to electrically connect the switch driving device A1 to an external circuit, for example. In the illustrated example, the second portion 22N is bent in the z direction toward the side that the first surface 31 faces.

The lead 2O is spaced apart from the plurality of leads 1. As shown in FIG. 9, the lead 2O is arranged on the conductive portion 5. The lead 2O is electrically connected to the conductive portion 5. The lead 2O is joined to the wiring portion 50O of the conductive portion 5 via the above-described conductive joining material 82.

The configuration of the lead 2O is not specifically limited, and is similar to the configuration of the lead 2C and includes a second portion 22O in the illustrated example.

The second portion 22O is a portion of the lead 2O that protrudes from the package 7 toward the side opposite to the plurality of leads 1 as viewed in the y direction. The second portion 22O is used to electrically connect the switch driving device A1 to an external circuit, for example. In the illustrated example, the second portion 22O is bent in the z direction toward the side that the first surface 31 faces.

The lead 2P is spaced apart from the plurality of leads 1. As shown in FIG. 9, the lead 2P is arranged on the conductive portion 5. The lead 2P is electrically connected to the conductive portion 5. The lead 2P is joined to the wiring portion 50P of the conductive portion 5 via the above-described conductive joining material 82.

The configuration of the lead 2P is not specifically limited, and is similar to the configuration of the lead 2C and includes a second portion 22P in the illustrated example.

The second portion 22P is a portion of the lead 2P that protrudes from the package 7 toward the side opposite to the plurality of leads 1 as viewed in the y direction. In the illustrated example, the second portion 22P is bent in the z direction toward the side that the first surface 31 faces.

The lead 2Z is spaced apart from the substrate 3 as viewed in the z direction. In the illustrated example, the lead 2Z is arranged on the side that the third surface 33 faces in the x direction with respect to the substrate 3. The lead 2Z is arranged on the side opposite to the lead 2B with respect to the lead 2A in the x direction.

The configuration of the lead 2Z is not specifically limited, and the lead 2Z is constituted by a second portion 22Z and a fourth portion 24Z in the example shown in FIG. 9. The lead 2Z is insulated from circuits of the switch driving device A1.

The fourth portion 24Z is continuous to the second portion 22Z and is covered by the package 7. Similarly to the fourth portion 24C of the lead 2C, the fourth portion 24Z is arranged at a position that is shifted with respect to the first portion 21A toward the side that the first surface 31 faces, in the z direction. The shape of the fourth portion 24Z is not specifically limited, and is a band shape that extends in the y direction in the illustrated example. An end portion of the fourth portion 24Z is flush with the sixth surface 75 of the package 7.

The second portion 22Z is continuous to the end portion of the fourth portion 24Z and is a portion of the lead 2Z that protrudes from the package 7. The second portion 22Z protrudes toward the side opposite to the fourth portion 24Z in the y direction. The second portion 22Z is used to mount the switch driving device A1 to an external circuit board, for example. In the illustrated example, the second portion 22Z is bent in the z direction toward the side that the first surface 31 faces.

As shown in FIG. 9, the second portions 22A, 22B, and 22C are arranged with a distance G21 therebetween in the x direction. These second portions are spaced apart from each other by substantially the same distance G21. The second portions 22C and 22D are arranged with a distance G22 therebetween in the x direction. The distance G22 is substantially the same as the distance G21. The second portions 22D to 22N are arranged with a distance G23 therebetween in the x direction. These second portions are spaced apart from each other by substantially the same distance G23 that is shorter than the distance G21. The second portions 22A and 22Z are arranged with a distance G24 therebetween in the x direction. The distance G24 is substantially the same as the distance G21.

<Transistors 4A to 4F>

The transistors 4A to 4F are arranged on the plurality of leads 1. Types and functions of the transistors 4A to 4F are not specifically limited. Although the illustrated example includes the six transistors 4A to 4F, this is one example and the number of transistors is not limited.

In the illustrated example, the transistors 4A to 4F are MOSFETs (SiC MOSFETs (Metal-Oxide-Semiconductor Field-Effect Transistors)) that include SiC (silicon carbide) substrates, for example. The transistors 4A to 4F may also be MOSFETs including Si (silicon) substrates instead of SiC substrates and include IGBT elements, for example. Alternatively, the transistors may also be MOSFETs that contain GaN. In the present embodiment, N-type MOSFETs are used as the transistors 4A to 4F. The following describes the transistor 4A and a description of the other transistors 4B to 4F is omitted.

As shown in FIGS. 9 and 13, the transistor 4A is arranged on the first portion 11A of the lead 1A. The transistor 4A includes a gate electrode GP, a source electrode SP, and a drain electrode DP. In the illustrated example, the source electrode SP and the gate electrode GP are arranged on a surface of the transistor 4A that faces the same side as the main surface 111A. The drain electrode DP is formed on a surface of the transistor 4A that faces the main surface 111A. The gate electrode GP and the source electrode SP are made of Al or an Al alloy (Al—Si, Al—Cu, Al—Si—Cu, etc.), for example. The drain electrode DP is made of Al or an Al alloy (Al—Si, Al—Cu, Al—Si—Cu, etc.), for example. Shapes and sizes of the gate electrode GP, the source electrode SP, and the drain electrode DP are not specifically limited. In the illustrated example, the source electrode SP is larger than the gate electrode GP as viewed in the z direction. As viewed in the z direction, the gate electrode GP is arranged on the side of the fifth surface 35 of the substrate 3 with respect to the center of the transistor 4A in the y direction. The source electrode SP includes a portion that is located on one side of the gate electrode GP in the y direction and portions that are located on opposite sides of the gate electrode GP in the x direction. The position of the gate electrode GP with respect to the source electrode SP is not specifically limited. The gate electrode GP may also have a square shape. The source electrode SP includes a recessed portion that is recessed from a side of the source electrode SP that faces the fifth surface 35, and the gate electrode GP is arranged in the recessed portion.

FIG. 14 is an enlarged cross-sectional view of a main portion schematically showing the transistor 4A. The transistor 4A includes a substrate 400, an epitaxial layer 401, a source wiring 411, a drain wiring 415, and a gate wiring 419.

The substrate 400 is made of SiC (silicon carbide) and doped with n-type impurities at a high concentration (e.g., 1e18 to 1e21 $cm^{-3}$). The substrate 400 includes a top surface 400A and a back surface 400B. The top surface 400A is an Si surface and the back surface 400B is a C surface.

The epitaxial layer 401 is layered on the top surface 400A of the substrate 400. The epitaxial layer 401 is an n-type layer that is formed from SiC and doped with n-type impurities at a concentration that is lower than the concentration in the substrate 400. The epitaxial layer 401 is formed on the substrate 400 through epitaxial growth. The epitaxial layer 401 formed on the top surface 400A, which is the Si surface, grows with an Si surface serving as a growth main surface. Accordingly, similarly to the top surface 400A of the substrate 400, a top surface 401A of the epitaxial layer 401 formed through the growth is an Si surface.

The epitaxial layer 401 includes a drain region 402, a body region 403, a source region 407, and a body contact region 408.

The drain region 402 is a portion (base layer portion) that is located on the C surface side, which is opposite to the top surface 401A. The drain region 402 is an n-type region and a post-epitaxial growth state is maintained as is in the entire drain region 402. The concentration of n-type impurities in the drain region 402 is 1e15 to 1e17 $cm^{-3}$, for example.

The body region 403 is formed on the side of the top surface 401A of the epitaxial layer 401. The body region 403 is in contact with the drain region 402 from the side of the top surface 401A (Si surface side) of the epitaxial layer 401. The concentration of p-type impurities in the body region 403 is 1e16 to 1e19 $cm^{-3}$, for example.

As shown in FIG. 14, a gate trench 404 is formed in the epitaxial layer 401. The gate trench 404 has a configuration that is formed by digging the trench from the top surface 401A, and is elongated in a direction ("direction extending along the gate width" or "gate width direction") that is perpendicular to the sheet face of FIG. 14. Accordingly, the gate trench 404 has a band shape that extends in a predetermined direction in plan view. FIG. 14 shows only the single gate trench 404, but a plurality of gate trenches 404 that extend parallel to each other in plan view are actually formed in the epitaxial layer 401, forming a so-called stripe structure.

Each gate trench 404 includes two side surfaces 404a and a bottom surface 404b. The two side surfaces 404a face each other with a distance therebetween and are each orthogonal to the top surface 401A. The bottom surface 404b is continuous to the two side surfaces 404a and includes a portion that is parallel to the top surface 401A. The gate trench 404 extends through the body region 403 in the thickness direction (up-down direction in FIG. 14), and the deepest portion (bottom surface 404b) of the gate trench 404 reaches the drain region 402.

A gate insulation film 405 is formed in the gate trench 404 to cover the entire inner surface (the side surfaces 404a and the bottom surface 404b) of the gate trench 404. As shown in FIG. 14, a portion of the gate insulation film 405 is located outside the gate trench 404 and partially covers the top surface 401A of the epitaxial layer 401. The gate insulation film 405 is constituted by an oxide film that contains nitrogen (Ni) (e.g., a silicon nitride oxide film that is formed through thermal oxidation using a nitrogen containing gas). The nitrogen content (nitrogen concentration) in the gate insulation film 405 is 0.1 to 10%, for example.

The gate insulation film 405 includes insulation film side portions 405a and an insulation film bottom portion 405b. The insulation film side portions 405a cover the side surfaces 404a of the gate trench 404. The insulation film bottom portion 405b covers the bottom surface 404b of the gate trench 404. In the illustrated example, a thickness T2 of the insulation film bottom portion 405b is equal to or smaller than a thickness T1 of the insulation film side portions 405a (T2≤T1). Specifically, the ratio (T2/T1) of the thickness T2 of the insulation film bottom portion 405b to the thickness T1 of the insulation film side portions 405a is 0.3 to 1, and preferably 0.5 to 1. The thickness T1 of the insulation film side portions 405a is 300 to 1000 Å, for example, and the thickness T2 of the insulation film bottom portion 405b is 150 to 500 Å, for example (under the provision that T2≤T1).

A gate electrode 406 is embedded on the inner side of the gate insulation film 405. The gate electrode 406 is formed by filling the inner side of the gate insulation film 405 with a polysilicon material that is doped with N-type impurities at a high concentration.

In a surface layer portion of the body region 403, the source region 407 is located on both sides of the gate trench 404 in a direction (left-right direction in FIG. 14) that is perpendicular to the gate width. The source region 407 is an n$^+$ type region. The source region 407 is doped with n-type impurities at a concentration that is higher than the concentration of n-type impurities in the drain region 402. The concentration of n-type impurities in the source region 407 is 1e18 to 1e21 cm$^{-3}$, for example. In plan view, the source region 407 is adjacent to the gate trench 404 and extends in the gate width direction.

As shown in FIG. 14, the body contact region 408 is a p$^+$ type region that extends downward from the top surface 401A through the source region 407 and is connected to the body region 403. In plan view, the body contact region 408 extends along a center line of the source region 407 (a straight line that passes through the center point of the source region 407 in a direction perpendicular to the gate width direction and is parallel to the gate width direction). The body contact region 408 is doped with p-type impurities at a high concentration that is higher than the concentration of p-type impurities in the body region 403. The concentration of p-type impurities in the body contact region 408 is 1e18 to 1e21 cm$^{-3}$, for example.

The gate trench 404 and the source region 407 are alternately provided in the direction perpendicular to the gate width direction and each extend along the gate width direction. A boundary between unit cells that are adjacent to each other in the direction perpendicular to the gate width direction is set on the source region 407, extending along the source region 407. At least one body contact region 408 is provided spanning two unit cells that are adjacent to each other in the direction perpendicular to the gate width direction. Also, a boundary between unit cells that are adjacent to each other in a direction extending along the gate width direction is set such that the gate electrode 406 included in each unit cell has a predetermined gate width.

An inter-layer insulation film 409 made of silicon oxide (SiO$_2$) is layered on the epitaxial layer 401. A contact hole 410 for exposing surfaces of the source region 407 and the body contact region 408 is formed in the inter-layer insulation film 409 and the gate insulation film 405.

The source wiring 411 is formed on the inter-layer insulation film 409. The source wiring 411 is in contact with (electrically connected to) the source region 407 and the body contact region 408 via the contact hole 410. The source wiring 411 includes a polysilicon layer 412, a metal layer 413, and an intermediate layer 414.

The polysilicon layer 412 is in contact with the source region 407 and the body contact region 408. The polysilicon layer 412 is a doped layer formed using doped polysilicon that is doped with impurities, and preferably is a high concentration doped layer doped with impurities at a concentration as high as 1e19 to 1e21 cm$^{-3}$, for example. N-type impurities such as phosphorus (P) and arsenic (As) and p-type impurities such as boron (B) can be used as impurities to form the polysilicon layer 412 as a doped layer (or a high concentration doped layer). The polysilicon layer 412 fills up the contact hole 410. The thickness of such a polysilicon layer 412 depends on the depth of the contact hole 410, and is 5000 to 1000 Å, for example.

The metal layer 413 is formed on the polysilicon layer 412. The metal layer 413 is made of aluminum (Al), gold (Au), silver (Ag), copper (Cu), an alloy of any of these metals, or a metal material that contains any of these metals, for example. The metal layer 413 constitutes the outermost layer of the source wiring 411, and a first wire 91A is bonded to the metal layer 413, for example. The thickness of the metal layer 413 is 1 to 5 μm, for example.

The intermediate layer 414 is interposed between the polysilicon layer 412 and the metal layer 413 and contains titanium (Ti). The intermediate layer 414 is constituted by a single layer containing titanium or a plurality of layers including a layer containing titanium. The layer containing titanium can be formed using titanium, titanium nitride (TiN), etc. The thickness of the intermediate layer 414 is 200 to 500 nm, for example.

The source wiring 411 including the polysilicon layer 412, the intermediate layer 414, and the metal layer 413 preferably has a layered structure (Po—Si/Ti/TiN/Al) that is formed by layering polysilicon (polysilicon layer 412), titanium (intermediate layer 414), titanium nitride (intermediate layer 414), and aluminum (metal layer 413) in this order.

The drain wiring 415 is formed on the back surface 400B of the substrate 400. The drain wiring 415 is in contact with (electrically connected to) the substrate 400. The drain wiring 415 includes a polysilicon layer 416, a metal layer 417, and an intermediate layer 418.

The polysilicon layer 416 is in contact with the substrate 400. The polysilicon layer 416 can be formed using a material that is similar to the material constituting the polysilicon layer 412. The thickness of the polysilicon layer 416 is 1000 to 2000 Å, for example.

The metal layer 417 is formed on the polysilicon layer 416. The metal layer 417 can be formed using a material that is similar to the material constituting the metal layer 413. The metal layer 417 constitutes the outermost layer of the drain wiring 415 and is joined to the first portion 11A of the lead 1A when the substrate 400 is mounted on the first portion 11A, for example. The thickness of the metal layer 417 is 0.5 to 1 μm, for example.

The intermediate layer 418 is interposed between the polysilicon layer 416 and the metal layer 417 and contains titanium (Ti). The intermediate layer 418 can be formed using a material that is similar to the material constituting the intermediate layer 414.

The gate wiring 419 is in contact with (electrically connected to) the gate electrode 406 via a contact hole (not shown) that is formed in the inter-layer insulation film 409. As a result of a predetermined voltage (voltage equal to or higher than the gate threshold voltage) being applied to the gate wiring 419 in a state in which a predetermined potential difference is generated between the source wiring 411 and the drain wiring 415 (i.e., between the source and the drain), a channel is formed in the vicinity of an interface between the body region 403 and the gate insulation film 405 by an electric field generated from the gate electrode 406. As a result, a current flows between the source wiring 411 and the drain wiring 415 and the transistor 4A is turned ON.

As shown in FIGS. 9, 12, and 13, three transistors 4A, 4B, and 4C are arranged on the main surface 111A of the first portion 11A of the lead 1A. The three transistors 4A, 4B, and 4C are spaced apart from each other in the x direction and overlap each other as viewed in the x direction. In the illustrated example, the drain electrodes DP of the transistors 4A, 4B, and 4C are joined to the main surface 111A via a conductive joining material 83.

The conductive joining material (second conductive joining material) 83 is only required to be capable of joining and electrically connecting the drain electrodes DP of the transistors 4A, 4B, and 4C to the main surface 111A. A silver paste, a copper paste, or solder is used as the conductive joining material 83, for example.

As shown in FIGS. 9 and 13, the transistor 4D is arranged on the main surface 111B of the first portion 11B of the lead 1B. In the illustrated example, the drain electrode DP of the transistor 4D is joined to the main surface 111B via the conductive joining material 83.

As shown in FIGS. 9 and 13, the transistor 4E is arranged on the main surface 111C of the first portion 11C of the lead 1C. In the illustrated example, the drain electrode DP of the transistor 4E is joined to the main surface 111C via the conductive joining material 83.

As shown in FIGS. 9 and 13, the transistor 4F is arranged on the main surface 111D of the first portion 11D of the lead 1D. In the illustrated example, the drain electrode DP of the transistor 4F is joined to the main surface 111D via the conductive joining material 83.

<Upper Driver Chip 4G and Lower Driver Chip 4H>

The upper driver chip 4G and the lower driver chip 4H are for driving and controlling at least one of the transistors 4A to 4F. As shown in FIGS. 9 and 10, the upper driver chip 4G and the lower driver chip 4H are electrically connected to the conductive portion 5 and at least one of the transistors 4A to 4F, and are arranged on the substrate 3. In the illustrated example, the upper driver chip 4G drives and controls three transistors 4A, 4B, and 4C. The lower driver chip 4H drives and controls three transistors 4D, 4E, and 4F. Shapes and sizes of the upper driver chip 4G and the lower driver chip 4H are not specifically limited. In the illustrated example, the upper driver chip 4G and the lower driver chip 4H have rectangular shapes as viewed in the z direction and are elongated in the x direction.

The upper driver chip 4G is mounted on the first base portion 55 of the conductive portion 5 and the lower driver chip 4H is arranged on the second base portion 56 of the conductive portion 5. The upper driver chip 4G is joined to the first base portion 55 via a conductive joining material 84. The lower driver chip 4H is joined to the second base portion 56 via the conductive joining material 84.

The conductive joining material 84 (third conductive joining material) is only required to be capable of joining the upper driver chip 4G to the first base portion 55 and joining and electrically connecting the lower driver chip 4H to the second base portion 56. A silver paste, a copper paste, or solder is used as the conductive joining material 84, for example. The specific shape of the conductive joining material 84 is not limited. The upper driver chip 4G and the lower driver chip 4H may also be joined to the first base portion 55 via a joining material having insulating properties instead of the conductive joining material 84.

As shown in FIG. 9, the upper driver chip 4G is located between the leads 2B to 2O and the leads 1A to 1G as viewed in the x direction. The lower driver chip 4H is located between the leads 2B to 2O and the leads 1A to 1G as viewed in the x direction. The upper driver chip 4G overlaps the transistor 4B as viewed in the y direction. In the illustrated example, the upper driver chip 4G overlaps the transistor 4A as viewed in the y direction. The lower driver chip 4H overlaps the transistor 4E as viewed in the y direction. The upper driver chip 4G may also overlap the transistor 4C as viewed in the y direction. The lower driver chip 4H may overlap any one or both of the transistors 4D and 4F as viewed in the y direction.

In the example shown in FIGS. 10 and 11, the upper driver chip 4G overlaps the wiring portions 50B, 50C, 50V, and 50W as viewed in the y direction. The upper driver chip 4G overlaps the second base portion 56 and the lower driver chip 4H as viewed in the x direction. The lower driver chip 4H overlaps the wiring portions 50I, 50J, 50K, and 50L as viewed in the y direction. The lower driver chip 4H overlaps the wiring portions 50O and 50P as viewed in the x direction.

<Boot Diodes 49U, 49V, 49W>

The boot diodes 49U, 49V, and 49W are electrically connected to the upper driver chip 4G. The boot diodes 49U, 49V, and 49W have a function of applying a higher voltage to the upper driver chip 4G, for example. As shown in FIGS. 9 and 10, the boot diode 49U is joined to the wiring portion 50U of the conductive portion 5 via a conductive joining material 85. The conductive joining material 85 is similar to the above-described conductive joining material 84, for example.

As shown in FIGS. 9 and 10, the boot diode 49V is joined to the wiring portion 50V of the conductive portion 5 via the above-described conductive joining material 85. The boot diode 49W is joined to the wiring portion 50W of the conductive portion 5 via the above-described conductive joining material 85.

Specific arrangement of the boot diodes 49U, 49V, and 49W is not limited. In the example shown in FIGS. 10 and 11, the center of the boot diode 49U in the y direction is shifted toward the fifth surface 35 side with respect to the center of the wiring portion 50U in the y direction. The center of the boot diode 49V in the x direction is shifted toward the wiring portion 50W side with respect to the center of the wiring portion 50V in the x direction. The center of the boot diode 49W in the x direction is shifted toward the wiring portion 50D side with respect to the center of the wiring portion 50W in the x direction.

<First Wires 91A to 91F>

First wires 91A to 91F (first conductive members) are connected to any of the transistors 4A to 4F and any of the plurality of leads 1. The material of the first wires 91A to 91F is not specifically limited, and is aluminum (Al) or copper (Cu), for example. The thickness of the first wires 91A to 91F is not specifically limited, and the first wires have a diameter of about 250 to 500 μm, for example. Leads that are made of Cu may also be used instead of the first wires 91A to 91F, for example.

As shown in FIG. 9, one end of the first wire 91A is connected to the source electrode SP of the transistor 4A and the other end of the first wire 91A is connected to the fourth portion 14B of the lead 1B. Positions of the source electrode SP and the fourth portion 14B to which the first wire 91A is joined are not specifically limited.

As shown in FIG. 9, one end of the first wire 91B is connected to the source electrode SP of the transistor 4B and the other end of the first wire 91B is connected to the fourth portion 14C of the lead 1C. Positions of the source electrode SP and the fourth portion 14C to which the first wire 91B is joined are not specifically limited.

As shown in FIG. 9, one end of the first wire 91C is connected to the source electrode SP of the transistor 4C and the other end of the first wire 91C is connected to the fourth portion 14D of the lead 1D. Positions of the source electrode SP and the fourth portion 14D to which the first wire 91C is joined are not specifically limited.

As shown in FIG. 9, one end of the first wire 91D is connected to the source electrode SP of the transistor 4D and the other end of the first wire 91D is connected to the fourth portion 14E of the lead 1E. Positions of the source electrode SP and the fourth portion 14E to which the first wire 91D is joined are not specifically limited.

As shown in FIG. 9, one end of the first wire 91E is connected to the source electrode SP of the transistor 4E and the other end of the first wire 91E is connected to the fourth portion 14F of the lead 1F. Positions of the source electrode SP and the fourth portion 14F to which the first wire 91E is joined are not specifically limited.

As shown in FIG. 9, one end of the first wire 91F is connected to the source electrode SP of the transistor 4F and the other end of the first wire 91F is connected to the fourth portion 14G of the lead 1G. Positions of the source electrode SP and the fourth portion 14G to which the first wire 91F is joined are not specifically limited.

<Second Wires 92>

As shown in FIG. 9, the plurality of second wires (second conductive members) 92 are connected to the upper driver chip 4G or the lower driver chip 4H. The material of the second wires 92 is not specifically limited, and is gold (Au), silver (Ag), copper (Cu), aluminum (Al), etc., for example. The thickness of the second wires 92 is not specifically limited, and the second wires 92 are thinner than the first wires 91A to 91F, for example. The second wires 92 have a diameter of about 10 μm to about 50 μm, for example. In the following description, second wires 92 that are connected to the upper driver chip 4G will be referred to as "second wires 92G" and second wires 92 that are connected to the lower driver chip 4H will be referred to as "second wires 92H".

As shown in FIG. 9, a second wire 92G is connected to the gate electrode GP of the transistor 4A and a portion of the upper driver chip 4G that is located on the first portion 11A side with respect to the center of the upper driver chip 4G in the y direction. Also, a second wire 92G is connected to the source electrode SP of the transistor 4A and a portion of the upper driver chip 4G that is located on the first portion 11A side with respect to the center of the upper driver chip 4G in the y direction. This second wire 92G is connected to a portion of the source electrode SP of the transistor 4A that is located on the transistor 4B side with respect to the gate electrode GP in the x direction.

As shown in FIG. 9, a second wire 92G is connected to the gate electrode GP of the transistor 4B and a portion of the upper driver chip 4G that is located on the first portion 11A side with respect to the center of the upper driver chip 4G in the y direction. Also, a second wire 92G is connected to the source electrode SP of the transistor 4B and a portion of the upper driver chip 4G that is located on the first portion 11A side with respect to the center of the upper driver chip 4G in the y direction. This second wire 92G is connected to a portion of the source electrode SP of the transistor 4B that is located on the transistor 4A side with respect to the gate electrode GP in the x direction.

As shown in FIG. 9, a second wire 92G is connected to the gate electrode GP of the transistor 4C and a portion of the upper driver chip 4G that is located on the first portion 11A side with respect to the center of the upper driver chip 4G in the y direction. Also, a second wire 92G is connected to the source electrode SP of the transistor 4C and a portion of the upper driver chip 4G that is located on the first portion 11A side with respect to the center of the upper driver chip 4G in the y direction. This second wire 92G is connected to a portion of the source electrode SP of the transistor 4C that is located on the transistor 4B side with respect to the gate electrode GP in the x direction.

As shown in FIG. 9, a second wire 92H is connected to the gate electrode GP of the transistor 4D and a portion of the lower driver chip 4H that is located on the first portion 11A side with respect to the center of the lower driver chip 4H in the y direction. A second wire 92H is connected to the gate electrode GP of the transistor 4E and a portion of the lower driver chip 4H that is located on the first portion 11A side with respect to the center of the lower driver chip 4H in the y direction. A second wire 92H is connected to the gate electrode GP of the transistor 4F and a portion of the lower driver chip 4H that is located on the first portion 11A side with respect to the center of the lower driver chip 4H in the y direction.

As shown in FIGS. 9 and 10, ends on one side of two second wires 92G are connected to the wiring portion 50A and ends on the other side of the two second wires 92G are connected to the upper driver chip 4G. Also, one end of a second wire 92G is connected to the boot diode 49U and the other end of the second wire 92G is connected to the upper driver chip 4G. Also, one end of a second wire 92G is connected to the wiring portion 50U and the other end of the second wire 92G is connected to the upper driver chip 4G.

As shown in FIGS. 9 and 10, ends on one side of two second wires 92G are connected to the wiring portion 50B and ends on the other side of the two second wires 92G are connected to the upper driver chip 4G. Also, one end of a second wire 92G is connected to the boot diode 49V and the other end of the second wire 92G is connected to the upper driver chip 4G. Also, one end of a second wire 92G is connected to the wiring portion 50V and the other end of the second wire 92G is connected to the upper driver chip 4G.

As shown in FIGS. 9 and 10, ends on one side of two second wires 92G are connected to the wiring portion 50C and ends on the other side of the two second wires 92G are connected to the upper driver chip 4G. Also, one end of a second wire 92G is connected to the boot diode 49W and the other end of the second wire 92G is connected to the upper driver chip 4G. Also, one end of a second wire 92G is connected to the wiring portion 50W and the other end of the second wire 92G is connected to the upper driver chip 4G.

As shown in FIGS. 9 and 10, one end of a second wire 92G is connected to the wiring portion 50D and the other end of the second wire 92G is connected to the upper driver chip 4G. Also, one end of a second wire 92G is connected to the wiring portion 50E and the other end of the second wire 92G is connected to the upper driver chip 4G. Also, one end of a second wire 92G is connected to the wiring portion 50F and the other end of the second wire 92G is connected to the upper driver chip 4G. Also, ends on one side of three second wires 92G are connected to the wiring portion 50G and ends on the other side of the three second wires 92G are connected to the upper driver chip 4G. Also, ends on one side of two second wires 92G are connected to the connection portion 57 and ends on the other side of the two second wires 92G are connected to the upper driver chip 4G.

As shown in FIG. 9, one end of a second wire 92H is connected to the wiring portion 50I and the other end of the second wire 92H is connected to the lower driver chip 4H. Also, one end of a second wire 92H is connected to the wiring portion 50J and the other end of the second wire 92H is connected to the lower driver chip 4H. Also, one end of a second wire 92H is connected to the wiring portion 50K and the other end of the second wire 92H is connected to the lower driver chip 4H. Also, ends on one side of two second wires 92H are connected to the wiring portion 50L and ends on the other side of the two second wires 92H are connected to the lower driver chip 4H. Also, one end of a second wire 92H is connected to the wiring portion 50M and the other end of the second wire 92H is connected to the lower driver chip 4H. Also, one end of a second wire 92H is connected to the wiring portion 50N and the other end of the second wire 92H is connected to the lower driver chip 4H. Also, ends on one side of two second wires 92H are connected to the wiring portion 50O and ends on the other side of the two second wires 92H are connected to the lower driver chip 4H.

<Resin Package 7>

The package 7 covers at least the transistors 4A to 4F, the upper driver chip 4G, the lower driver chip 4H, portions of the plurality of leads 1, and portions of the plurality of leads 2. In the illustrated example, the package 7 also covers the boot diodes 49U, 49V, and 49W, the plurality of first wires 91A to 91F, and the plurality of second wires 92. The material of the package 7 is not specifically limited, and an insulation material such as an epoxy resin, silicone gel, etc., is appropriately used, for example.

The length DX (see FIG. 7) of the package 7 in the x direction is preferably not longer than 60 mm. The length DY of the package 7 in the y direction is preferably not longer than 35 mm. The length DZ (see FIG. 6) of the package 7 in the z direction is preferably not longer than 6 mm. In the illustrated example, the package 7 has a length DX of about 57 mm, a length DY of about 30 mm, and a length DZ of about 5 mm.

The package 7 includes a first surface 71, a second surface 72, a third surface 73, a fourth surface 74, a sixth surface 75, a sixth surface 76, and recessed portions 710, 720, 731, 732, 733, and 734.

The first surface 71 intersects the z direction, and is a flat surface that is perpendicular to the z direction in the illustrated example. The first surface 71 faces the same side as the first surface 31 of the substrate 3. The second surface 72 intersects the z direction, and is a flat surface that is perpendicular to the z direction in the illustrated example. The second surface 72 faces the side that is opposite to the first surface 71 and is the same as the side that the second surface 32 of the substrate 3 faces.

The third surface 73 is located between the first surface 71 and the second surface 72 in the z direction, and is continuous to the first surface 71 and the second surface 72 in the illustrated example. The third surface 73 intersects the x direction and faces the same side as the third surface 33 of the substrate 3. The fourth surface 74 is located between the first surface 71 and the second surface 72 in the z direction, and is continuous to the first surface 71 and the second surface 72 in the illustrated example. The fourth surface 74 intersects the x direction and faces the side that is opposite to the third surface 73 and is the same as the side that the fourth surface 34 of the substrate 3 faces.

The sixth surface 75 is located between the first surface 71 and the second surface 72 in the z direction, and is continuous to the first surface 71 and the second surface 72 in the illustrated example. The sixth surface 75 intersects the y direction and faces the same side as the fifth surface 35 of the substrate 3. The sixth surface 76 is located between the first surface 71 and the second surface 72 in the z direction, and is continuous to the first surface 71 and the second surface 72 in the illustrated example. The sixth surface 76 intersects the y direction and faces the side that is opposite to the sixth surface 75 and is the same as the side that the sixth surface 36 faces.

The recessed portion 710 is recessed from the third surface 73 in the x direction. The recessed portion 710 reaches the first surface 71 and the second surface 72. The recessed portion 720 is recessed from the fourth surface 74 in the x direction. The recessed portion 720 reaches the first surface 71 and the second surface 72.

As shown in FIG. 9, the recessed portions 731, 732, 733, and 734 are recessed from the sixth surface 75 in the y direction. The recessed portion 731 is located between the second portion 22Z of the lead 2Z and the second portion 22A of the lead 2A as viewed in the y direction. The recessed portion 732 is located between the second portion 22A of the lead 2A and the second portion 22B of the lead 2B as viewed in the y direction. The recessed portion 733 is located between the second portion 22B of the lead 2B and the second portion 22C of the lead 2C as viewed in the y direction. The recessed portion 734 is located between the second portion 22C of the lead 2C and the second portion 22D of the lead 2D as viewed in the y direction.

As shown in FIGS. 2 and 9, the drains of the transistors 4A to 4C are connected to each other and a P terminal (lead 1A). The source of the transistor 4A is connected to the drain of the transistor 4D, the source of the transistor 4B is connected to the drain of the transistor 4E, and the source of the transistor 4C is connected to the drain of the transistor 4F. A node N1 between the source of the transistor 4A and the drain of the transistor 4D is connected to a U terminal (lead 1B). A node N2 between the source of the transistor 4B and the drain of the transistor 4E is connected to a V terminal (lead 1C). A node N3 between the source of the transistor 4C and the drain of the transistor 4F is connected to a W terminal (lead 1D). The source of the transistor 4D is connected to an NU terminal (lead 1E), the source of the transistor 4E is connected to an NV terminal (lead 1F), and the source of the transistor 4F is connected to an NW terminal (lead 1G).

The level of voltages applied to the U terminal (lead 1B), the V terminal (lead 1C), and the W terminal (lead 1D) is about 0 V to about 650 V, for example. On the other hand, the level of voltages applied to the NU terminal (lead 1E), the NV terminal (lead 1F), and the NW terminal (lead 1G) is about 0 V, for example, and is lower than the level of voltages applied to the U terminal (lead 1B), the V terminal (lead 1C), and the W terminal (lead 1D). The transistors 4A to 4C constitute transistors on a high-potential side of a three-phase inverter circuit and the transistors 4D to 4F constitute transistors on a low-potential side of the three-phase inverter circuit.

The gates of the transistors 4A to 4C are connected to the upper driver chip 4G, and the sources of the transistors 4A to 4C are connected to the upper driver chip 4G. The gates of the transistors 4D to 4F are connected to the lower driver chip 4H.

The upper driver chip 4G is electrically connected to a VBU terminal (lead 2A), a VBV terminal (lead 2B), a VBW terminal (lead 2C), a first VCC terminal (lead 2D), an HINU terminal (lead 2E), an HINV terminal (lead 2F), an HINW terminal (lead 2G), and a first GND terminal (lead 2H). The first VCC terminal is a terminal for supplying a power source voltage VCC to the upper driver chip 4G. Gate signal voltages are applied from an external gate drive circuit (not shown) to the HINU terminal, the HINV terminal, and the HINW terminal. The upper driver chip 4G is a circuit for applying these gate signal voltages to the gates of the transistors 4A to 4C. The first GND terminal (lead 2H) and a second GND terminal (lead 2O) are connected to each other inside the switch driving device A1, more specifically, at the conductive portion 5 on the substrate 3.

The lower driver chip 4H is electrically connected to an LINU terminal (lead 2I), an LINV terminal (lead 2J), an LINW terminal (lead 2K), a second VCC terminal (lead 2L), an FO terminal (lead 2M), a CIN terminal (lead 2N), and the second GND terminal (lead 2O). The second VCC terminal is a terminal for supplying the power source voltage VCC to the lower driver chip 4H. Gate signal voltages are applied from an external gate drive circuit to the LINU terminal, the LINV terminal, and the LINW terminal. The lower driver chip 4H is a circuit for applying these gate signal voltages to the gates of the transistors 4D to 4F.

A first voltage of electrical signals given to the HINU terminal (lead 2E), the HINV terminal (lead 2F), and the HINW terminal (lead 2G) is lower than a second voltage (power source voltage VCC) that is applied from the first VCC terminal (lead 2D) to drive the upper driver chip 4G. Also, the first voltage of electrical signals given to the LINU terminal (lead 2I), the LINV terminal (lead 2J), and the LINW terminal (lead 2K) is lower than the second voltage (power source voltage VCC) that is applied from the second VCC terminal (lead 2L) to drive the lower driver chip 4H.

Next, functions of the switch driving device A1 will be described.

As shown in FIGS. 3 and 5, the current limiting portion 465 is provided on a path that electrically connects the boot capacitor BC1 and the boot diode 49U to each other. Accordingly, the current limiting portion 465 is provided in a region that has the same potential (voltage VB) as the boot capacitor BC1, which is a floating power supply, and is isolated from a region that has the same potential as the control voltage VCC supplied from the first power source PW1. With this configuration, the current limiting portion 465 can be made to operate in a region in which the potential is stabilized.

As shown in FIGS. 9 and 10, the boot diodes 49U, 49V, and 49W are joined and electrically connected to the wiring portions 50U, 50V, and 50W, respectively. The wiring portions 50U, 50V, and 50W are spaced apart from any other portion of the conductive portion 5 including the wiring portions 50A, 50B, and 50C. If the wiring portions 50U, 50V, and 50W are constituted by metal leads, a situation is envisaged in which it is difficult to support the wiring portions 50U, 50V, and 50W in a manufacturing process of the switch driving device A1. In the present embodiment, the wiring portions 50U, 50V, and 50W are supported by the substrate 3. Therefore, the wiring portions 50U, 50V, and 50W spaced apart from any other portion of the conductive portion 5 can be appropriately realized.

FIGS. 16 to 20 show variations and other embodiments of the present disclosure. In these drawings, elements that are the same as or similar to those in the above-described embodiment are denoted using the same reference signs as those used in the above-described embodiment.

<First Variation of First Embodiment>

Figure 16:
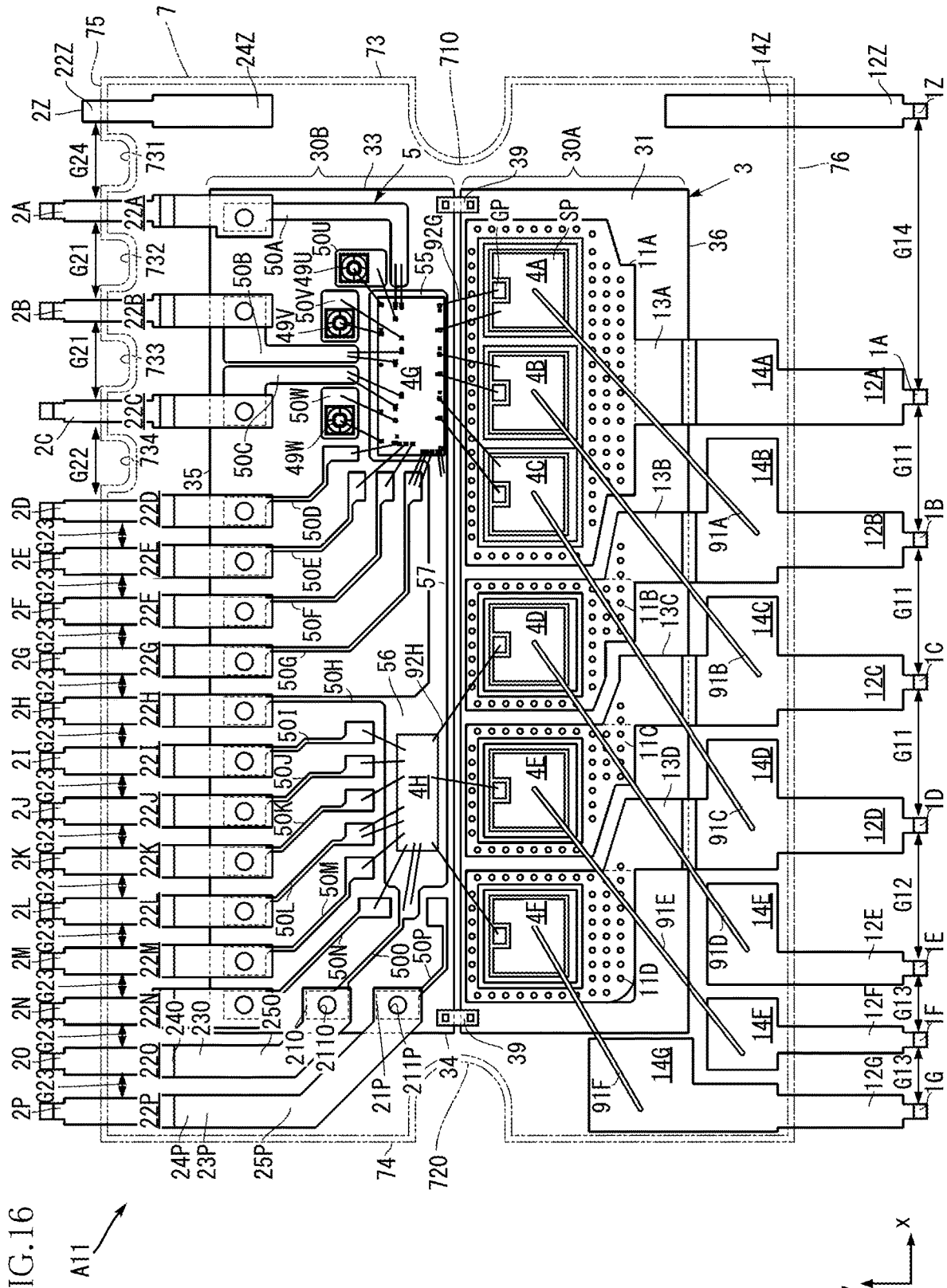
FIG. 16 is a plan view showing a first variation of the switch driving device according to the first embodiment.

FIG. 16 shows a first variation of the switch driving device A1. A switch driving device A11 shown in the drawing differs from the above-described switch driving device A1 in the configuration of the substrate 3.

In the substrate 3 according to this variation, the first region 30A and the second region 30B are formed separately from each other.

The material of the first region 30A is similar to the material of the substrate 3 of the above-described switch driving device A1, and is a ceramic such as alumina ($Al_2O_3$), silicon nitride (SiN), aluminum nitride (AlN), alumina containing zirconia, etc., for example. The plurality of joining portions 6 are formed in the first region 30A.

The second region 30B is constituted by a printed circuit board, for example. Specifically, the second region 30B includes a base material constituted by an insulation material, such as a glass epoxy resin, and a wiring pattern that is formed on the base material. The conductive portion 5 in this variation is constituted by the wiring pattern of the printed circuit board.

In the illustrated example, the first region 30A and the second region 30B are coupled to each other using coupling members 39. The coupling members 39 are for fixing positions of the first region 30A and the second region 30B relative to each other in the manufacturing process of the switch driving device A11, for example. The manner for fixing the coupling members 39 to the first region 30A and the second region 30B is not specifically limited. The coupling members 39 may be constituted by an insulation material or an electrically conductive material. In the latter case, predetermined positions of the conductive portion 5 and the plurality of joining portions 6 may be electrically connected to each other by the coupling members.

Functions and effects that are the same as those of the switch driving device A1 can also be achieved with this variation. Also, as can be understood from this variation, the specific configuration of the substrate 3 is not limited and can be changed in various manners so long as switch driving control using the above-described transistors 4A to 4F can be realized.

<Second Variation of First Embodiment>

Figure 17:
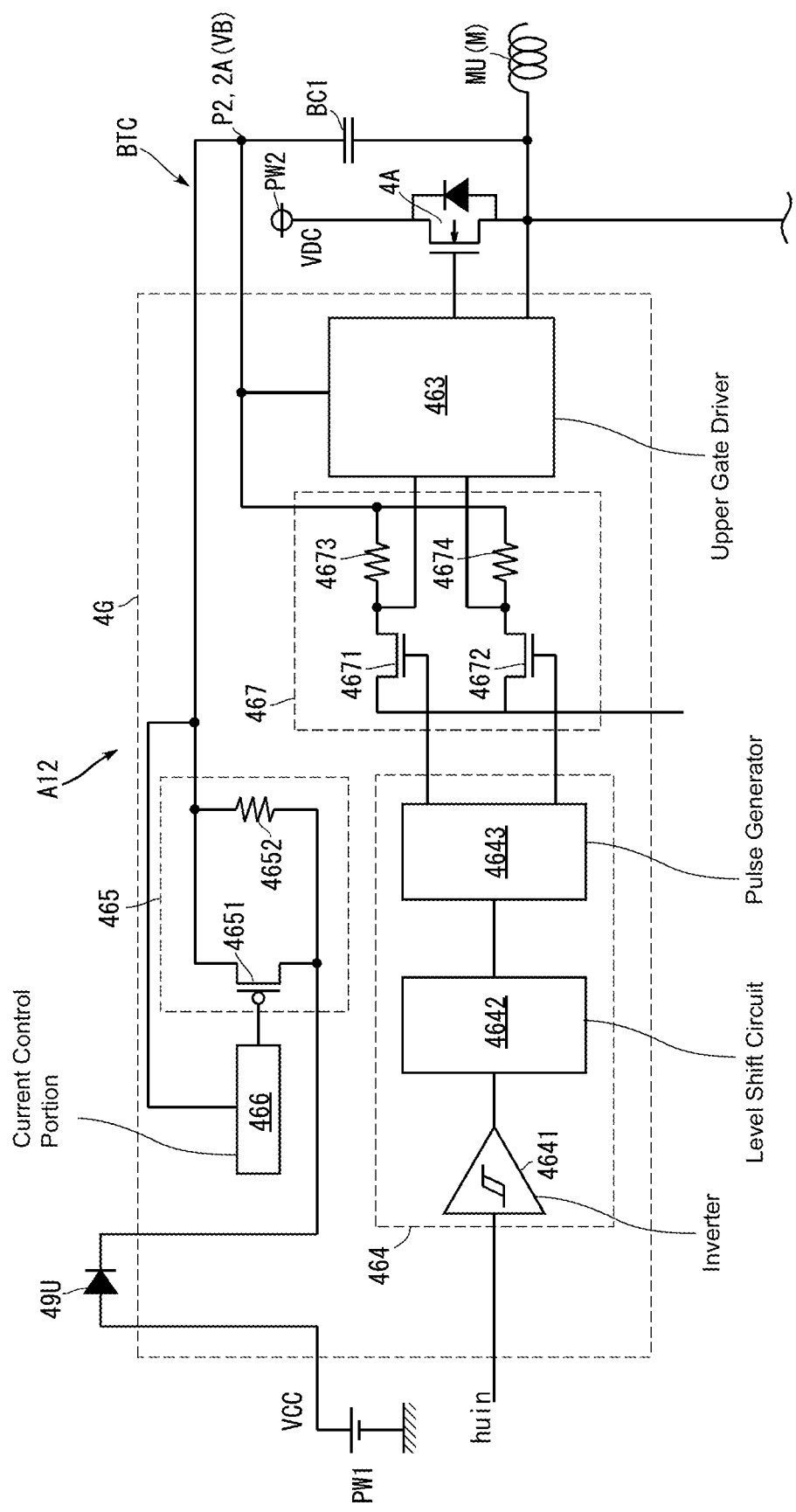
FIG. 17 is a circuit diagram of an upper driver circuit of a second variation of the switch driving device according to the first embodiment.

FIG. 17 shows a second variation of the switch driving device A1. A switch driving device A12 shown in the drawing differs from the above-described switch driving device A1 in the configuration of the current limiting portion 465 included in an upper driver circuit.

In this variation, the current limiting portion 465 includes a transistor 4651 and a resistor 4652. The resistor 4652 is arranged on a path that connects the boot diode 49U to the boot capacitor BC1 and is located in a region that has the same potential as the boot capacitor BC1, which is a floating power supply. The resistor 4652 determines the value of a current to be supplied to the boot capacitor BC1. The transistor 4651 is connected in parallel to the resistor 4652. The transistor 4651 is a P-type MOSFET. The source of the transistor 4651 is connected to a connection point between the cathode of the boot diode 49U and the resistor 4652. The drain of the transistor 4651 is connected to a connection point between the resistor 4652 and the boot capacitor BC1. A signal is input from the current control portion 466 to the gate of the transistor 4651.

For example, R1 represents the resistance value of the resistor 4652 and R2 represents the resistance value of the transistor 4651. At this time, the resistance value R1>the resistance value R2. If the voltage VB is at least the threshold voltage, the transistor 4651 is turned OFF based on a signal input from the current control portion 466. Accordingly, the resistance value of the current limiting portion 465 becomes R1. On the other hand, if the voltage VB is lower than the threshold voltage, the transistor 4651 is turned ON based on a signal input from the current control portion 466. Accordingly, the resistance value of the current limiting portion 465 becomes a combined resistance value of the transistor 4651 and the resistor 4652 connected in parallel, i.e., R1×R2/(R1+R2). Namely, if the voltage VB is at least the threshold voltage, the resistance value of the current limiting portion 465 is increased and a voltage drop that occurs at the current limiting portion 465 is increased. As a result, the current used to charge the boot capacitor BC1 is reduced. To the contrary, if the voltage VB is lower than the threshold voltage, the resistance value of the current limiting portion 465 is reduced and a voltage drop that occurs at the current limiting portion 465 is reduced. As a result, the current used to charge the boot capacitor BC1 is increased.

If the above-described configuration is employed, the following advantages can be achieved. Namely, if a user sets the control voltage VCC to a high voltage, the margin for excessive charging is small and accordingly the resistance value can be increased. On the other hand, if a user sets the control voltage VCC to a low voltage, the margin for excessive charging is large and accordingly the resistance value can be reduced.

As can be understood from this variation, the specific configuration of the current limiting portion 465 is not limited, and it is possible to employ a configuration in which electrical connection between the boot diode 49U and the boot capacitor BC1 is switched ON/OFF or a configuration in which the resistance value of the conduction path between the boot diode 49U and the boot capacitor BC1 is appropriately switched.

Second Embodiment

Figure 18:
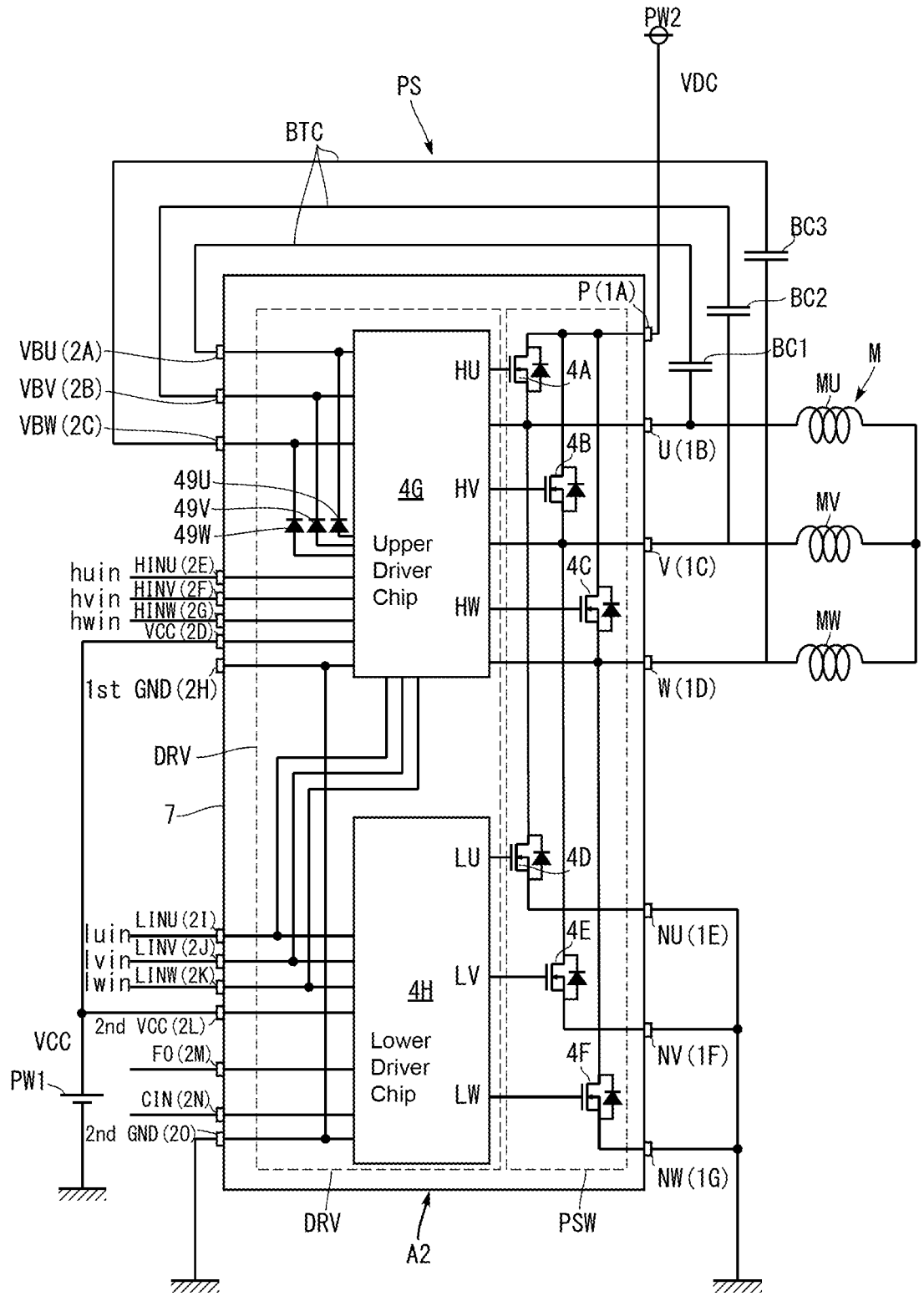
FIG. 18 is a block diagram of a power supply portion that includes a switch driving device according to a second embodiment.
Figure 19:
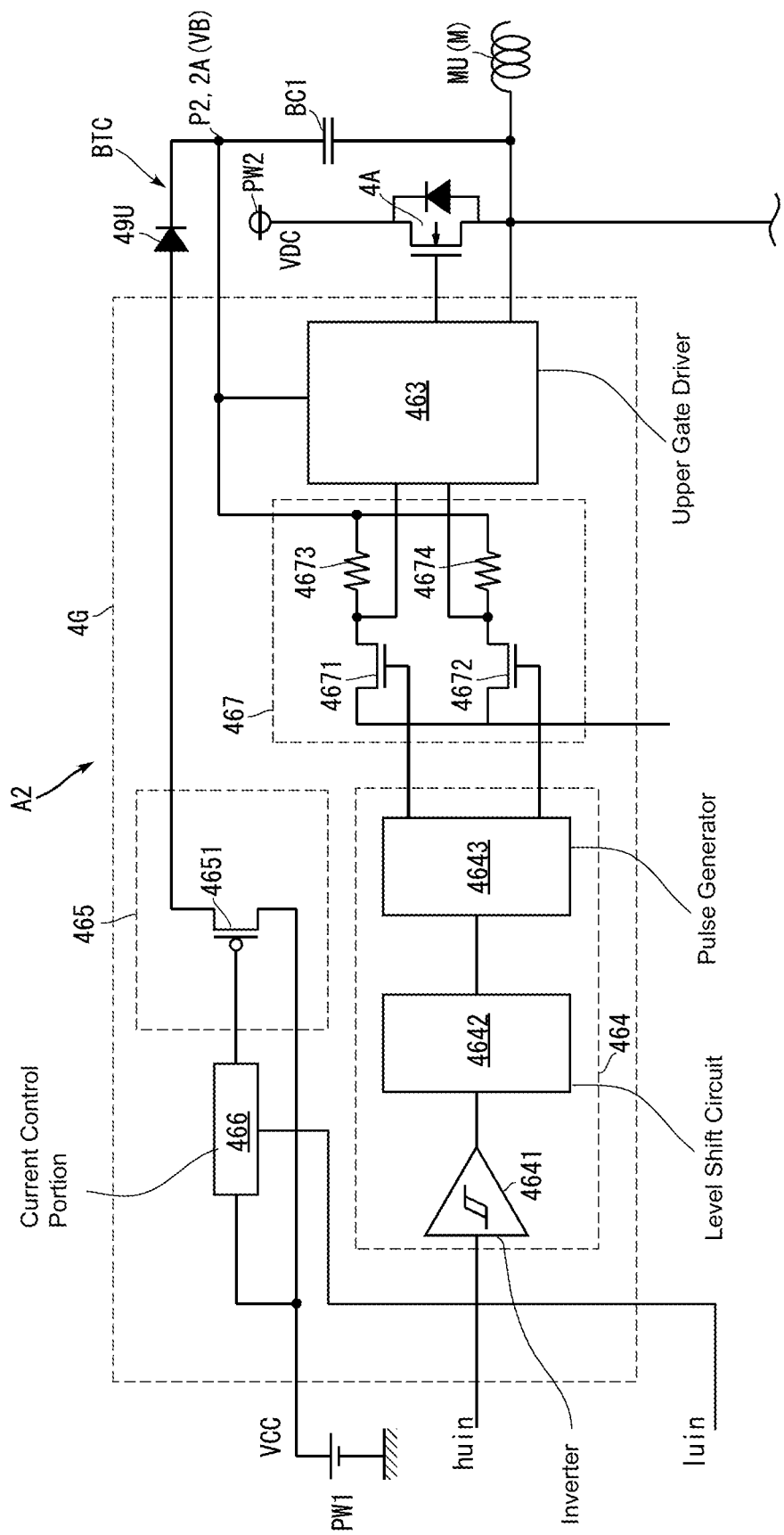
FIG. 19 is a circuit diagram of one example of an upper driver circuit of the switch driving device according to the second embodiment.
Figure 20:
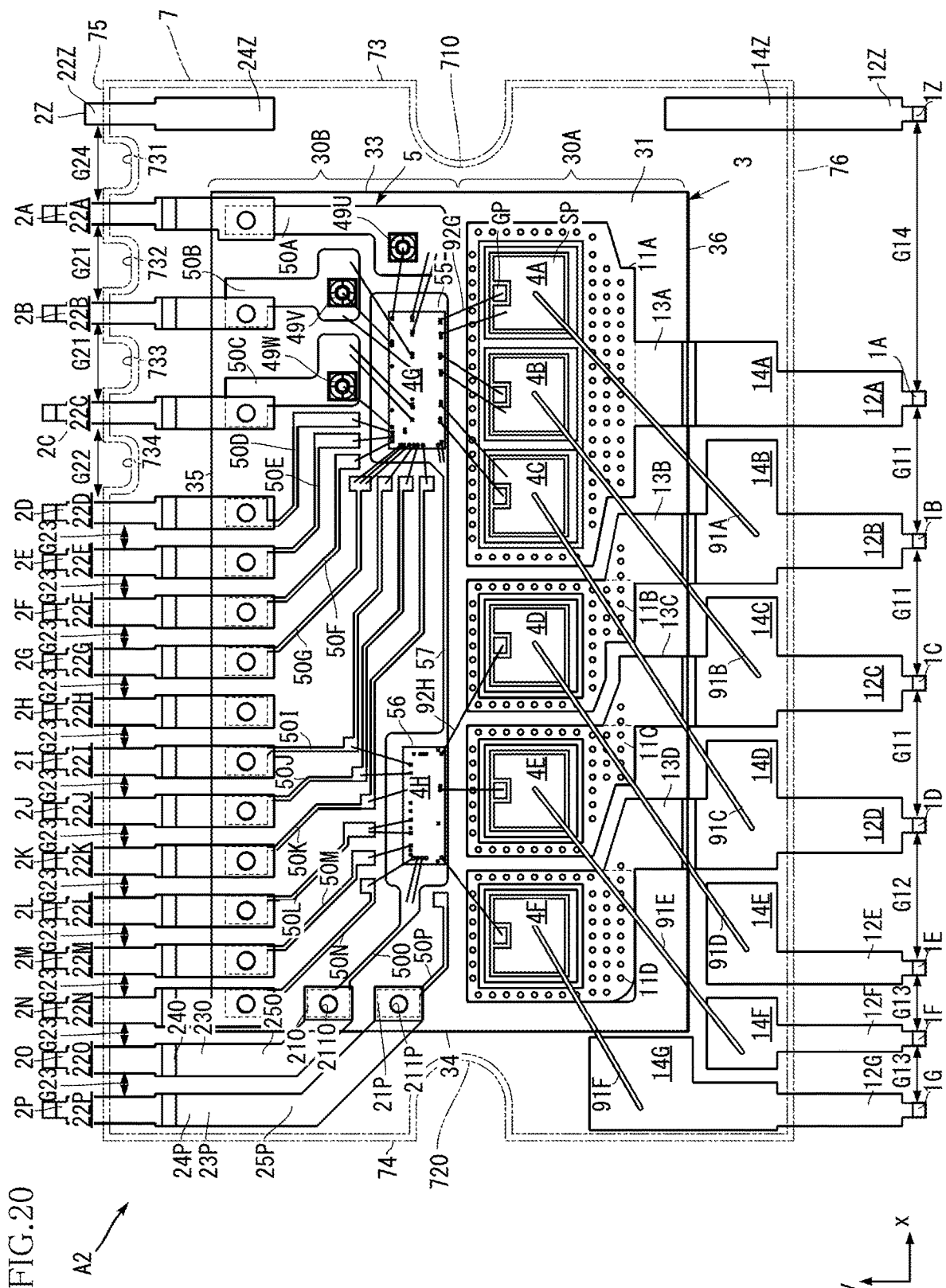
FIG. 20 is a plan view showing the switch driving device according to the second embodiment.

FIGS. 18 to 20 show a switch driving device according to a second embodiment. A switch driving device A2 shown in the drawing differs from the above-described switch driving devices A1 and A11 in the specific configuration that realizes control for restricting charging of the boot capacitors BC1, BC2, and BC3.

FIG. 18 is a block diagram of a power supply portion that includes the switch driving device A2. FIG. 19 is a circuit diagram showing one example of an upper driver circuit of the switch driving device A2. FIG. 20 is a plan view showing the switch driving device A2.

As shown in FIG. 18, in the present embodiment, electricity supply control signals luin, lvin, and lwin that are input to the LINU terminal (lead 2I), the LINV terminal (lead 2J), and the LINW terminal (lead 2K) are input to the upper driver chip 4G.

Control for restricting charging of the boot capacitor BC1 performed using the electricity supply control signal luin will be described with reference to FIG. 19. Control for restricting charging of the boot capacitor BC2 performed using the electricity supply control signal lvin and control for restricting charging of the boot capacitor BC3 performed using the electricity supply control signal lwin are similar to the control for restricting charging of the boot capacitor BC1, and therefore a description thereof is omitted.

In the illustrated example, the transistor 4651 of the current limiting portion 465 is arranged in a circuit that connects the first power source PW1 to the boot diode 49U. The transistor 4651 switches ON or OFF a current to be supplied to the boot capacitor BC1. The transistor 4651 is a P-type MOSFET and the source of the transistor 4651 is connected to the first power source PW1. The drain of the transistor 4651 is connected to the boot diode 49U. A signal is input from the current control portion 466 to the gate of the transistor 4651. The configuration of the current limiting portion 465 is not limited to that shown in the drawing, and may also be the same as the configuration of the current limiting portion 465 of the switch driving device A12 described with reference to FIG. 17.

The electricity supply control signal luin is input to the current control portion 466. When the electricity supply control signal luin=H and the transistor 4D is to be turned ON, the current control portion 466 turns the transistor 4651 OFF and restricts charging of the boot capacitor BC1.

FIG. 20 shows an example of the configuration of the switch driving device A2. As shown in the drawing, in the switch driving device A2, the wiring portions 50I, 50J, and 50K of the conductive portion 5 pass through the vicinity of the second base portion 56 and extend to the vicinity of the upper driver chip 4G. Second wires 92H are individually connected to the lower driver chip 4H and the wiring portions 50I, 50J, and 50K. Second wires 92G are individually connected to the upper driver chip 4G and the wiring portions 50I, 50J, and 50K.

The boot diode 49U is joined and electrically connected to the wiring portion 50A. The boot diode 49V is joined and electrically connected to the wiring portion 50B. The boot diode 49W is joined and electrically connected to the wiring portion 50C. Second wires 92G are individually connected to the upper driver chip 4G and the wiring portions 50A, 50B, and 50C.

With this configuration as well, excessive charging of the boot capacitors BC1, BC2, and BC3 (which occurs when the lower transistors 4D, 4E, and 4F are turned ON) in the above-described modes 1 and 2 can be suppressed.

A switch driving device according to the present disclosure is not limited to the above-described embodiments etc. Various design changes can be freely made to specific configurations of portions of the switch driving device according to the present disclosure.

Clause 1.

A switch driving device comprising:
- a gate driver configured to drive an N-type semiconductor switch element;
- a bootstrap circuit including a boot capacitor and a boot diode and being configured to apply a voltage to the gate driver;
- a current limiting portion configured to limit a current to be supplied to the boot capacitor; and
- a current control portion configured to control operations of the current limiting portion,
- wherein the current limiting portion is provided on a path that electrically connects the boot capacitor and the boot diode to each other.

Clause 2.

The switch driving device according to clause 1, wherein when a charging voltage of the boot capacitor exceeds a threshold value, the current control portion drives the current limiting portion to limit a current to be supplied to the boot capacitor.

Clause 3.

The switch driving device according to clause 2, wherein the current limiting portion includes a switch element that is switched ON or OFF based on a signal input from the current control portion.

Clause 4.

The switch driving device according to clause 3, wherein the current control portion detects the charging voltage of the boot capacitor based on at least either one of a voltage between both ends of the boot capacitor and a divided voltage of the voltage between both ends of the boot capacitor.

Clause 5.

The switch driving device according to any one of clauses 1 to 4, wherein the N-type semiconductor switch element includes a semiconductor substrate that is obtained using SiC as a raw material.

Clause 6.

The switch driving device according to any one of clauses 1 to 5, further comprising:
- a substrate;
- a conductive portion formed on the substrate;
- a first lead disposed on the substrate;
- a driver chip including the gate driver; and
- a resin portion that covers the driver chip, at least a portion of the substrate, and a portion of the first lead,
- wherein the first lead supports the N-type semiconductor switch element, and
- the boot diode and the driver chip are disposed on the conductive portion.

Clause 7.

The switch driving device according to clause 6, wherein the substrate includes a first surface and the conductive portion is formed on the first surface.

Clause 8.

The switch driving device according to clause 7, wherein the substrate includes a second surface opposite to the first surface, and
the second surface is exposed from the resin portion.

Clause 9.

The switch driving device according to clause 7 or 8, wherein the first lead is disposed on the first surface of the substrate.

Clause 10.

The switch driving device according to clause 9, further comprising a first joining material that joins the first lead to the substrate.

Clause 11.

The switch driving device according to any one of clauses 7 to 10, further comprising a second lead spaced apart from the first lead,
wherein the second lead is electrically connected to the conductive portion.

Clause 12.

The switch driving device according to clause 11, further comprising a first conductive joining material that joins the second lead to the conductive portion.

Clause 13.

The switch driving device according to clause 12, wherein the conductive portion includes a first wiring portion and a second wiring portion that are spaced apart from each other, and
the boot capacitor is joined and electrically connected to the first wiring portion and the second lead is joined and electrically connected to the second wiring portion.

Clause 14.

The switch driving device according to clause 13, further comprising a plurality of wires, wherein the plurality of wires connect the driver chip to the boot diode, the first wiring portion, and the second wiring portion, respectively.

Clause 15.

The switch driving device according to clause 14, wherein the first wiring portion is arranged between the driver chip and the second lead.

Clause 16.

The switch driving device according to clause 15, wherein the second wiring portion includes a portion adjacent to the first wiring portion.

Clause 17.

The switch driving device according to any one of clauses 13 to 16, wherein the first wiring portion is spaced apart from any portion of the conductive portion other than the first wiring portion.

REFERENCE SIGNS

A1, A11, A2: switch driving device
1: (first) lead
2: (second) lead
3: substrate
4A, 4B, 4C: upper transistor
4D, 4E, 4F: lower transistor
4G: upper driver chip
4H: lower driver chip
5: conductive portion
6: joining portion
7: package
49U, 49V, 49W: boot diode
91: first wire
92: second wire
463: upper gate driver
464: input signal control circuit
465: current limiting portion
466: current control portion
467: high withstand voltage level shift circuit
4631: clamping circuit
4641: inverter
4642: level shift circuit
4643: pulse generator
4651: transistor
4652: resistor
4671, 4672: transistor
4673, 4674: resistor
BC1, BC2, BC3: boot capacitor BTC: bootstrap circuit
M: motor
MCU: motor control unit
MMC: motor driving system

The invention claimed is:

1. A switch driving device comprising:
a gate driver configured to drive an N-type semiconductor switch element;
a bootstrap circuit including a boot capacitor and a boot diode and being configured to apply a voltage to the gate driver;
a current limiting portion configured to limit a current to be supplied to the boot capacitor;
a current control portion configured to control operations of the current limiting portion; and
a high withstand voltage level shift circuit configured to connect one of a connection point between the boot capacitor and the boot diode and a grounding point to the gate driver in accordance with an electricity supply control signal,
wherein the current limiting portion is provided on a path that electrically connects the boot capacitor and the boot diode to each other.

2. The switch driving device according to claim 1, wherein when a charging voltage of the boot capacitor exceeds a threshold value, the current control portion drives the current limiting portion to limit a current to be supplied to the boot capacitor.

3. The switch driving device according to claim 2, wherein the current limiting portion includes a switch element that is switched ON or OFF based on a signal input from the current control portion.

4. The switch driving device according to claim 3, wherein the current control portion detects the charging voltage of the boot capacitor based on at least either one of a voltage between both ends of the boot capacitor and a divided voltage of the voltage between both ends of the boot capacitor.

5. The switch driving device according to claim 1, wherein the N-type semiconductor switch element includes a semiconductor substrate that is obtained using SiC as a raw material.

6. A switch driving device comprising:
a gate driver configured to drive an N-type semiconductor switch element;
a bootstrap circuit including a boot capacitor and a boot diode and being configured to apply a voltage to the gate driver;
a current limiting portion configured to limit a current to be supplied to the boot capacitor;
a current control portion configured to control operations of the current limiting portion;
a substrate;
a conductive portion formed on the substrate;
a first lead disposed on the substrate;
a driver chip including the gate driver; and
a resin portion that covers the driver chip, at least a portion of the substrate, and a portion of the first lead,
wherein the current limiting portion is provided on a path that electrically connects the boot capacitor and the boot diode to each other,
the first lead supports the N-type semiconductor switch element, and
the boot diode and the driver chip are disposed on the conductive portion.

7. The switch driving device according to claim 6, wherein the substrate includes a first surface and the conductive portion is formed on the first surface.

8. The switch driving device according to claim 7, wherein the substrate includes a second surface opposite to the first surface, and
the second surface is exposed from the resin portion.

9. The switch driving device according to claim 7, wherein the first lead is disposed on the first surface of the substrate.

10. The switch driving device according to claim 9, further comprising a first joining material that joins the first lead to the substrate.

11. The switch driving device according to claim 7, further comprising a second lead spaced apart from the first lead,
wherein the second lead is electrically connected to the conductive portion.

12. The switch driving device according to claim 11, further comprising a first conductive joining material that joins the second lead to the conductive portion.

13. The switch driving device according to claim 12, wherein the conductive portion includes a first wiring portion and a second wiring portion that are spaced apart from each other, and
the boot capacitor is joined and electrically connected to the first wiring portion and the second lead is joined and electrically connected to the second wiring portion.

14. The switch driving device according to claim 13, further comprising a plurality of wires, wherein the plurality of wires connect the driver chip to the boot diode, the first wiring portion, and the second wiring portion, respectively.

15. The switch driving device according to claim 14, wherein the first wiring portion is arranged between the driver chip and the second lead.

16. The switch driving device according to claim 15, wherein the second wiring portion includes a portion adjacent to the first wiring portion.

17. The switch driving device according to claim 13, wherein the first wiring portion is spaced apart from any portion of the conductive portion other than the first wiring portion.

* * * * *